US010845402B2

(12) United States Patent
Fukui et al.

(10) Patent No.: US 10,845,402 B2
(45) Date of Patent: Nov. 24, 2020

(54) ELECTROMAGNETIC FIELD IMAGING DEVICE

(71) Applicant: National Institute of Information and Communications Technology, Tokyo (JP)

(72) Inventors: Shinji Fukui, Aichi (JP); Muneo Yorinaga, Aichi (JP); Masahiro Tsuchiya, Tokyo (JP)

(73) Assignee: National Institute of Information and Communications Technology, Tokyo (JP)

( * ) Notice: Subject to any disclaimer, the term of this patent is extended or adjusted under 35 U.S.C. 154(b) by 284 days.

(21) Appl. No.: 16/085,040

(22) PCT Filed: Mar. 17, 2017

(86) PCT No.: PCT/JP2017/011005
§ 371 (c)(1),
(2) Date: Sep. 14, 2018

(87) PCT Pub. No.: WO2017/159869
PCT Pub. Date: Sep. 21, 2017

(65) Prior Publication Data
US 2019/0056443 A1 Feb. 21, 2019

(30) Foreign Application Priority Data
Mar. 17, 2016 (JP) .................................. 2016-053945

(51) Int. Cl.
*G01R 29/08* (2006.01)
(52) U.S. Cl.
CPC ..... *G01R 29/0885* (2013.01); *G01R 29/0892* (2013.01)

(58) Field of Classification Search
CPC ....... G01R 29/0885; G01R 29/12; H04N 5/30
See application file for complete search history.

(56) References Cited

U.S. PATENT DOCUMENTS

| 5,543,723 A | 8/1996 | Shinagawa et al. |
| 2004/0183529 A1 | 9/2004 | Kajiwara et al. |

(Continued)

FOREIGN PATENT DOCUMENTS

| JP | 02238376 A | 9/1990 |
| JP | 057229 A | 3/1993 |

(Continued)

OTHER PUBLICATIONS

International Search Report, International Application No. PCT/JP2017/011005, dated Jun. 13, 2017.

(Continued)

*Primary Examiner* — Maurice C Smith
(74) *Attorney, Agent, or Firm* — Renner, Otto, Boisselle & Sklar, LLP

(57) ABSTRACT

An electromagnetic field imaging device according to one aspect of the present disclosure includes a polarizing optical member arranged to face an imaging subject. A modulated light from a laser light source is influenced by an electric field from the imaging subject in the polarizing optical member. The modulated light subjected to the influence of the electric field is imaged as a detection light. The polarizing optical member is supported in a state of being movable in a direction of a plate thickness of the polarizing optical member. The plate thickness of the polarizing optical member is no larger than 1.2 times a minimum void interval of a wiring of the imaging subject.

8 Claims, 13 Drawing Sheets

(56) References Cited

U.S. PATENT DOCUMENTS

2009/0224753 A1  9/2009  Nakada et al.
2011/0043653 A1  2/2011  Ikeno et al.

FOREIGN PATENT DOCUMENTS

| JP | 2004264143 A | 9/2004 |
|---|---|---|
| JP | 2005308455 A | 11/2005 |
| JP | 2011043375 A | 3/2011 |
| JP | 2011169680 A | 9/2011 |
| WO | 2007004691 A1 | 11/2007 |

OTHER PUBLICATIONS

International Preliminary Report on Patentability with translation of the Written Opinion of the International Searching Authority, International Application No. PCT/JP2017/011005, dated Sep. 27, 2018 (FormPCT/IB/338; Form PCT/IB/373; and Form PCT/ISA/237).

(CRYSTAL THICKNESS Dt=10 μm)

(CRYSTAL THICKNESS Dt=350 μm)

ELECTROMAGNETIC FIELD IMAGING DEVICE

CROSS-REFERENCE TO RELATED APPLICATION

The present international application claims priority based on Japanese Patent Application No. 2016-053945 filed to Japanese Patent Office on Mar. 17, 2016, and the entire disclosure of Japanese Patent Application No. 2016-053945 is incorporated herein by reference.

TECHNICAL FIELD

The present disclosure relates to a technique of imaging an electromagnetic field generated from an imaging subject, and displaying the imaged result.

BACKGROUND ART

A variety of techniques of measuring a spatial distribution of an electric field or a magnetic field on various types of wiring through which a high frequency signal propagates, various types of electronic components, and furthermore, an arbitrary plane, and imaging the measurement result have been proposed. The electric field or the magnetic field is sometimes collectively referred to as an electromagnetic field.

Patent Document 1 as indicated below describes a technique using an electro-optical effect on a light by an electro-optical crystal to visualize an electric field distribution on a circuit, and a technique using a magneto-optical effect on a light by a magneto-optical crystal to visualize an magnetic field distribution on a circuit. The electro-optical crystal and the magneto-optical crystal have a property in which when an electromagnetic field exists within the crystal, a polarization state of the light that has entered the crystal changes by such an electromagnetic field.

PRIOR ART DOCUMENTS

Patent Documents

Patent Document 1: Japanese Unexamined Patent Application Publication No. 2011-43375

SUMMARY OF THE INVENTION

Problems to be Solved by the Invention

High resolution is demanded on the technique using the electro-optical crystal or the magneto-optical crystal to visualize the electromagnetic field distribution as described in Patent Document 1. The resolution of the electromagnetic field distribution is influenced by a refracted electromagnetic field integral effect in the interior of the electro-optical crystal or the magneto-optical crystal used.

In recent years, with advancement in miniaturization of a wiring pattern in an IC chip, for example, a plurality of wirings are sometimes formed at very small intervals of about a few µm. When measuring the electromagnetic field distribution on such a wiring pattern using the electro-optical crystal or the magneto-optical crystal, the refracted electric field integral effect in the interior of the electro-optical crystal or the magneto-optical crystal becomes greater as the intervals of the adjacent wirings are smaller, and the electromagnetic field generated from the respective wiring is not resolved visually.

In one aspect of the present disclosure, it is desirable to image the distribution of the electromagnetic field generated from the imaging subject including the microscopic wiring with high resolution and display the imaged result using a polarizing optical member while stably supporting the polarizing optical member having an electro-optical effect or a magneto-optical effect.

Means for Solving the Problems

An electromagnetic field imaging device according to one aspect of the present disclosure is configured to image an electromagnetic field, which is an electric field or a magnetic field, generated from an imaging subject including at least a wiring. The electromagnetic field imaging device includes a modulated light outputter, a polarizing optical member, a first supporting member, a reflection member, a second supporting member, a polarized light processor, a photoelectric convertor, and an image processor. The wiring is a conductor for transmitting an electric signal, and the specific mode of the signal to be transmitted, for example, the voltage value, the current value, the frequency, the waveform, and the like are not particularly limited.

The modulated light outputter is configured to be able to output a modulated light that is obtained through modulation at a specific modulation frequency. The polarizing optical member, which is a plate-shaped member having an electro-optical effect or a magneto-optical effect, is arranged so that an opposing surface, which is one of the plate surfaces, faces the imaging subject and the modulated light output from the modulated light outputter enters an incident surface, which is the other one of the plate surfaces, in a perpendicular direction, and configured so that a polarization state and a phase of the modulated light that has entered the member are changed by application of the electromagnetic field when the electromagnetic field exists in the member and the modulated light after the change exits. Hereinafter, the modulated light after the change is referred to as a detection light. The term "perpendicular" referred to herein is not limited to perpendicular in a strict sense, and may not strictly be perpendicular as long as the intended effect can be obtained.

The first supporting member is attached to the incident surface of the polarizing optical member to support the polarizing optical member, and is configured so that both the modulated light and the detection light can be transmitted therethrough. The reflection member is a member attached to the opposing surface of the polarizing optical member to reflect the modulated light that has entered the polarizing optical member and propagated to the opposing surface toward the incident surface. The second supporting member is configured to support the first supporting member so as to be movable in a direction of a plate thickness (i.e., perpendicular direction) of the polarizing optical member.

The polarized light processor is configured to convert the detection light caused to exit from the polarizing optical member through the first supporting member to a light modulated according to an intensity and a phase of the electromagnetic field.

The photoelectric convertor is arranged to receive the detection light output from the polarized light processor and modulated in the intensity and the phase of the electromagnetic field, and configured to photoelectric-convert the received detection light to an electric signal and output the electric signal.

The image processor generates and displays a two-dimensional image indicating a distribution of the electromagnetic field generated from the imaging subject based on the electric signal output from the photoelectric convertor and the modulation frequency. The two-dimensional image to be displayed here may be at least one of the various types of images of a real time still image, a real time moving image, a recorded still image, and a recorded moving image.

The polarizing optical member is configured so that the plate thickness becomes no larger than 1.2 times the minimum void interval of the wiring. The plate thickness is the length in the perpendicular direction in the polarizing optical member. The minimum void interval of the wiring is the smallest interval of the intervals of the adjacent wiring in the imaging subject.

Using such an electromagnetic field imaging device, as the polarizing optical member is configured to be relatively movable in the perpendicular direction with respect to the imaging subject, even if the polarizing optical member and the imaging subject are brought into contact when relatively closely attaching the polarizing optical member and the imaging subject, the polarizing optical member can be suppressed from damage by such contact. That is, the polarizing optical member can be closely attached to the imaging subject while stably supporting the polarizing optical member. Furthermore, as the plate thickness of the polarizing optical member is no larger than 1.2 times the minimum void interval of the wiring, the electromagnetic field distribution from the imaging subject including the wiring can be imaged with high resolution and low invasiveness, and the imaging result can be displayed. The term "low invasiveness" referred to herein means an extent that the electromagnetic field of the imaging subject and the periphery thereof is not disturbed even if the polarizing optical member and a member supporting the same are brought closer to the imaging subject.

Figure 1:
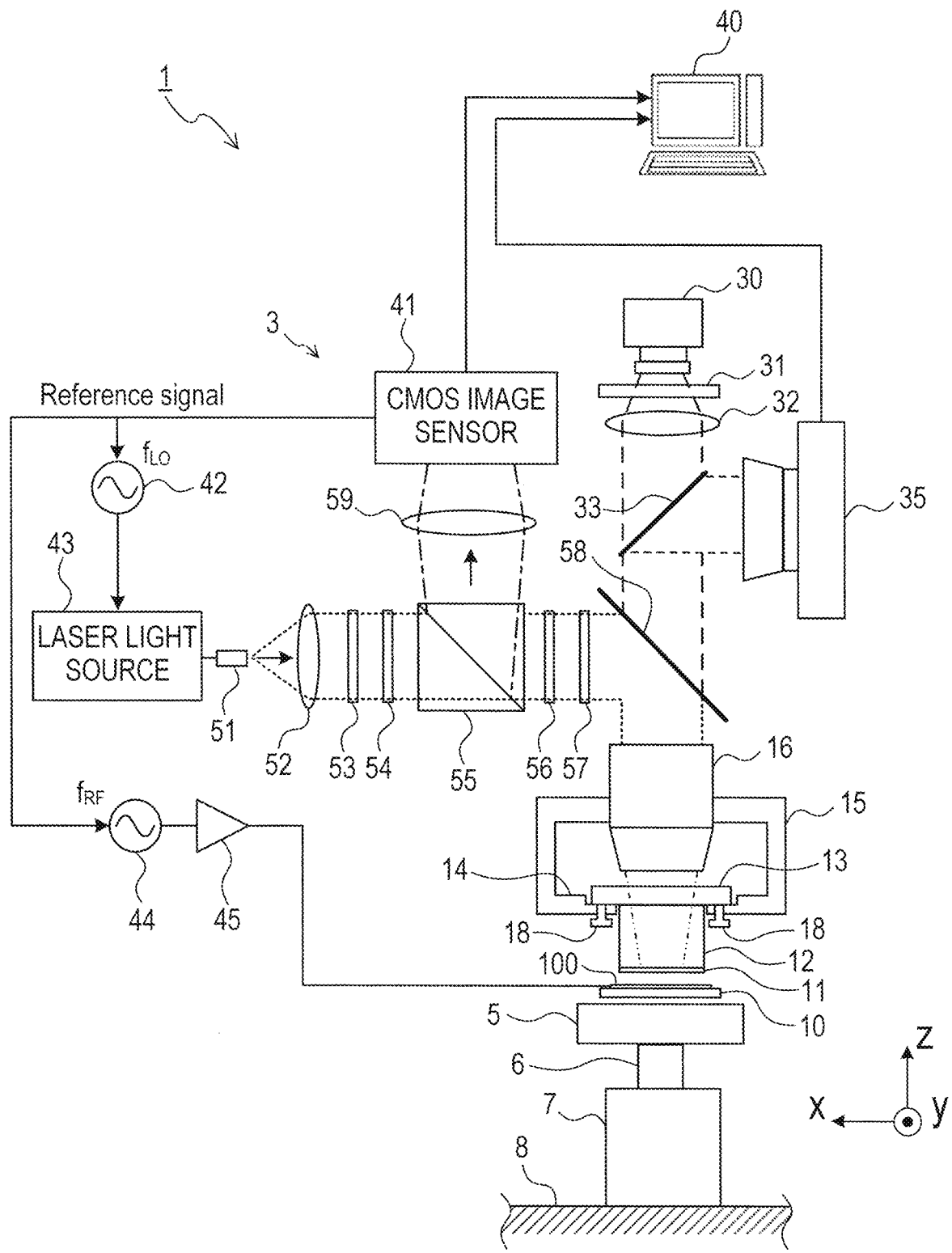
FIG. 1 is an explanatory view showing an outline of an electromagnetic field imaging device of a first embodiment.

EXPLANATION OF REFERENCE NUMERALS 1, 80 . . . electromagnetic field imaging device, 5 . . . table, 7 . . . position elevation angle adjusting device, 8 . . . floor surface, 10 . . . imaging subject, 11, 70 . . . electro-optical crystal, 12 . . . first supporting glass, 13 . . . second supporting glass, 14 . . . holder bottom plate, 14$a$ . . . supporting recess, 15 . . . holder main body, 15$a$ . . . supporting hole, 16 . . . object lens, 21 . . . reflection film, 22, 23 . . . anti-reflection film, 25 . . . crystal side marker, 30 . . . LED illumination, 33 . . . half mirror, 35 . . . camera, 40 . . . imaging control system, 41 . . . CMOS image sensor, 42 . . . light modulation oscillator, 43 . . . laser light source, 44 . . . transmitting signal oscillator, 51 . . . fiber end, 52 . . . collimator lens, 58 . . . dichroic mirror, 70$x$ . . . x-axis direction crystal portion, 70$y$ . . . y-axis direction crystal portion, 70$z$ . . . z-axis direction crystal portion, 81 . . . spatial polarization controller, 100 . . . wiring pattern, 101 . . . subject side marker

MODE FOR CARRYING OUT THE INVENTION

Hereinafter, example embodiments of the present disclosure will be described with reference to the drawings.

First Embodiment (1) Outline of Electromagnetic Field Imaging Device

An electromagnetic field imaging device 1 of the present embodiment shown in FIG. 1 is configured to be able to image an electromagnetic field from an imaging subject 10, that is, an electric field or a magnetic field generated from the imaging subject 10, and image-output the imaging result as a two-dimensional image. The two-dimensional image that can be image-output is at least one of a real time still image, a real time moving image, a recorded still image, and a recorded moving image in the present embodiment. Which one of the electric field or the magnetic field is to be imaged is determined according to which member, a member (e.g., electro-optical crystal) having an electro-optical effect or a member (e.g., magneto-optical crystal) having a magneto-optical effect is used as a polarizing optical member, to be described later.

In the present embodiment, the imaging subject 10 is a circuit board formed with a wiring pattern 100 including a wiring for transmitting a signal. The signal transmitted through the wiring pattern 100 is, for example, a signal in a band of a few hundred MHz to a few dozen GHz, that is, a signal in a band of a microwave to a millimeter wave. The frequency of the signal transmitted through the wiring pattern 100 is not limited to the frequency described above, and merely needs to be a frequency band at which the electro-optical effect or the magneto-optical effect is obtained in the polarizing optical member.

The electromagnetic field imaging device 1 can image the electromagnetic field from the wiring pattern 100. As shown in FIG. 1, the electromagnetic field imaging device 1 of the present embodiment includes a laser light source 43 that outputs a modulated light. A light modulation signal having a light modulation frequency fLO is input from a light modulation oscillator 42 (hereinafter referred to as "oscillator 42") to the laser light source 43. The laser light source 43 generates a laser light of a specified wavelength, amplitude-modulates the laser light with the light modulation signal, and outputs a modulated light, which is the amplitude-modulated laser light. The wavelength of the modulated light output from the laser light source 43 is, for example, 780 nm in the present embodiment. A specified reference signal is input from a CMOS image sensor 41 to the oscillator 42. The reference signal causes the oscillator 42 and the CMOS image sensor 41 to operate in synchronization.

The modulated light being the laser light is merely an example, and it is not essential that the modulated light is the laser light. A light source other than the laser light source may be used, and the light from such light source may be modulated and output as the modulated light.

Furthermore, the electromagnetic field imaging device 1 includes a transmitting signal oscillator 44 (hereinafter referred to as "oscillator 44") for generating a transmitting signal to be provided to the imaging subject 10. The oscillator 44 generates the transmitting signal having a signal frequency fRF, and outputs the same. The transmitting signal output from the oscillator 44 is amplified by an amplifier 45, and provided to the imaging subject 10. The transmitting signal is transmitted through the wiring pattern 100 of the imaging subject 10. The reference signal is also input to the oscillator 44. The reference signal causes the oscillator 44 and the CMOS image sensor 41 to operate in synchronization. That is, the oscillator 42, the oscillator 44, and the CMOS image sensor 41 operate in synchronization.

The modulated light output from the laser light source 43 is introduced to a fiber end 51 through an optical fiber, and exits from the fiber end 51. The modulated light that has exited from the fiber end 51 is caused to enter an object lens 16 through a polarizing optical system. The modulated light that has entered the object lens 16 is transmitted through a second supporting glass 13 and a first supporting glass 12, and caused to enter an electro-optical crystal 11 serving as a polarizing optical member.

An electro-optical crystal 11 is a crystal having an electro-optical effect. The electro-optical effect is, as well known, a phenomenon in which a polarization state of the light that has entered the electro-optical crystal changes by the influence of the electric field in the electro-optical crystal. The electro-optical crystal 11 of the present embodiment is, for example, ZnTe. The electro-optical crystal 11 may be other types of crystals other than ZnTe. Furthermore, the polarizing optical member does not need to be a crystal, and may be other polarizing optical members having the electro-optical effect other than the electro-optical crystal.

In the present embodiment, an example in which the electro-optical crystal 11 is used as the polarizing optical member is shown. The electromagnetic field imaging device 1 of the present embodiment is configured to be able to image the electric field of the electromagnetic field generated from the imaging subject 10. The magnetic field generated from the imaging subject 10 can be imaged by using a magneto-optical crystal in place of the electro-optical crystal 11. Even when imaging a magnetic field distribution, using a magneto-optical crystal is merely an example, and other polarizing optical members having a magneto-optical effect other than the crystal may be used.

The electro-optical crystal 11 has a thin plate-like shape in which the plate surface is a square as a whole. The electro-optical crystal 11 is arranged so that one of the plate surfaces faces the imaging subject 10. More specifically, the electro-optical crystal 11 is arranged to make contact with an upper surface of the imaging subject 10 (specifically, upper surface of the wiring pattern 100) so that the electromagnetic field in the vicinity of immediately above the wiring pattern 100, in particular, of the electromagnetic field from the imaging subject 10 enters the electro-optical crystal 11. It is not essential to bring the electro-optical crystal 11 and the imaging subject 10 into contact, and the electro-optical crystal and the imaging subject may be arranged in a separated state. In this case, however, the interval is preferably a short interval so that an imaging result with desired resolution can be obtained.

The modulated light output from the fiber end 51 enters an object lens 16 through the polarizing optical system. In the present embodiment, the entire structure including a ¼ wavelength plate 53, a ½ wavelength plate 54, a polarization beam splitter 55, a ¼ wavelength plate 56, and a ½ wavelength plate 57 is a polarizing optical system. The polarizing optical system is an optical system that handles a polarization state. The polarization state generally refers to a phase relationship of the polarization planes orthogonal to each other.

The modulated light output from the fiber end 51 is converted to a parallel light flux by a collimator lens 52. The modulated light converted to the parallel light flux by the collimator lens 52 passes through the ¼ wavelength plate 53, the ½ wavelength plate 54, and the polarization beam splitter 55, which are the polarizing optical system, so that the polarization state and the intensity are adjusted. The modulated light that has passed the polarization beam splitter 55 further passes through the ¼ wavelength plate 56 and the ½ wavelength plate 57, and becomes an elliptically polarized light after exiting the ½ wavelength plate 57. The modulated light that has become the elliptically polarized light has an optical axis bent in the direction of the object lens 16 by a dichroic mirror 58. The modulated light of which optical axis has been bent by the dichroic mirror 58 enters the electro-optical crystal 11 through the object lens 16, the second supporting glass 13, and the first supporting glass 12. The modulated light perpendicularly enters the plate surface of the electro-optical crystal 11.

The modulated light that has entered the electro-optical crystal 11 is reflected by a surface on an opposite side of an incident surface, which the modulated light has entered, in the electro-optical crystal 11, and again exits from the incident surface. The modulated light reflected in the electro-optical crystal 11 and caused to exit from the incident surface is a light of which polarization state has changed according to the electric field in the electro-optical crystal 11 (i.e., electric field radiated from the imaging subject 10). The modulated light reflected in the electro-optical crystal 11 and caused to exit from the incident surface is hereinafter referred to as a detection light.

The modulated light that has entered the electro-optical crystal 11 is subjected to modulation of a local polarization state by the electric field generated from the wiring pattern 100, through which the transmitting signal having a signal frequency fRF is transmitted, in the electro-optical crystal 11, and exits from the electro-optical crystal 11 as a detection light. The detection light caused to exit from the electro-optical crystal 11 is a light in which the modulated light that has entered the electro-optical crystal 11 is an elliptically polarized light in which one part of a polarization component proportional to an electric field intensity from the imaging subject 10 is phase-modulated, and includes information on a local intensity distribution and a local phase of the electric field in the electro-optical crystal 11.

The modulation frequency of the modulated light entering the electro-optical crystal 11 is the light modulation frequency fLO. The detection light reflected in the electro-optical crystal 11 and again caused to exit, on the other hand, has the polarization state changed with respect to the modulated light that has entered. Specifically, the polarization state of the detection light is an elliptically polarized light that depends on the intensity, frequency, and phase of the electric field generated from the imaging subject 10 and existing in the electro-optical crystal 11, and at the same time, that includes planar distribution information of the electric field.

A time response of the electro-optical crystal 11 is extremely high speed, and has high frequency responsiveness following the signal frequency fRF of the electromagnetic field generated by the imaging subject 10, and the distribution of the polarization state also responds to the signal frequency fRF of the electromagnetic field in the vicinity of the imaging subject 10.

The detection light of the elliptically polarized light that has exited from the electro-optical crystal 11 is caused to enter the CMOS image sensor 41 through one part of the polarizing optical system described above and an imaging lens 59. One part of the polarizing optical system referred to herein specifically indicates the ½ wavelength plate 57, the ¼ wavelength plate 56, and the polarization beam splitter 55.

The detection light exiting from the electro-optical crystal 11 has one part of the polarization component phase-modulated by the signal frequency fRF of the transmitting signal of the imaging subject 10, as will be described later. The phase-modulated detection light is converted to an intensity-modulated light by passing through one part of the polarizing optical system described above. The detection light converted to the intensity-modulated light is caused to enter the CMOS image sensor 41 through the imaging lens 59.

The intensity modulation means modulating so that a light receiving luminosity when the light is received by the CMOS image sensor 41 continuously changes reflecting the electric field intensity, the frequency, and the phase of the imaging subject. According to the intensity modulation by one part of the polarizing optical system described above, the detection light that has exited from the electro-optical crystal 11, specifically, the detection light of the elliptically polarized light in which one part of the polarization component proportional to the electric field intensity from the imaging subject 10 is phase-modulated is converted to a laser light in which a light intensity changes proportional to the electric field intensity from the imaging subject 10. The polarization beam splitter 55 has a role of taking out one of the two polarization components contained in the detection light that has entered. The polarization component taken out to the upper side, specifically, the imaging lens 59 side by the polarization beam splitter 55 is a polarization component on which the electric field intensity, the frequency, and the phase of the imaging subject 10 are reflected by the intensity modulation.

That is, the polarization beam splitter 55, the ¼ wavelength plate 56, and the ½ wavelength plate 57, which constitute one part of the polarizing optical system, fulfill the function of converting the modulated light to the elliptically polarized light in a course of the modulated light output from the fiber end 51 advancing toward the electro-optical crystal 11. The polarization beam splitter 55, the ¼ wavelength plate 56, and the ½ wavelength plate 57, on the other hand, fulfill the function of converting the detection light to the intensity-modulated light in a course of the detection light of the elliptically polarized light phase-modulated and caused to exit from the electro-optical crystal 11 advancing toward the CMOS image sensor 41.

The imaging lens 59 causes the detection light from the polarization beam splitter 55 to form an image on the CMOS image sensor 41. The detection light caused to form an image on the CMOS image sensor 41 is photoelectric-converted to an electric signal by the CMOS image sensor 41. The electric signal after the photoelectric conversion by the CMOS image sensor 41 is input to an imaging control system 40.

After receiving the detection light and photoelectric-converting the detection light to the electric signal, the CMOS image sensor 41 filters a specific frequency component from the electric signal, and outputs a sine component and a cosine component of the specific frequency.

The imaging control system 40 includes a display device (e.g., liquid crystal display) capable of displaying images, and outputs a two-dimensional image in which the electric field is visualized to a display device based on the electric signal output from the CMOS image sensor 41. Specifically, the imaging control system 40 calculates the intensity and the phase of the electromagnetic field of the imaging subject based on the sine component and the cosine component of the specific frequency contained in the electric signal input from the CMOS image sensor 41, and outputs the same as the two-dimensional image data.

The imaging control system 40 can visualize the change in the electromagnetic field from the imaging subject 10 as a moving image by displaying phase information and amplitude information of the electromagnetic field of the imaging subject that change every second for every pixel as change in hue and concentration. That is, the imaging control system 40 can not only display the electromagnetic field from the imaging subject 10 at a certain instant as a still image, but can also display the electromagnetic field from the imaging subject 10 as the moving image. Such images can be displayed in real time, or can be recorded and checked later. Thus, the user is able to know, in real time, a generation state of the electromagnetic field from the imaging subject 10 and the change of the electromagnetic field in accordance with elapse in time from the imaging subject 10 through the two-dimensional image, and is also able to check, analyze, and the like the generation state of and the change of the electromagnetic field later, based on a recorded data.

The modulated light that has entered the electro-optical crystal 11 is reflected by a reflection film 21 of the electro-optical crystal 11, and again passes through the electro-optical crystal 11 to exit as the detection light. The illustration of the reflection film 21 is omitted in FIG. 1, and will be illustrated in FIG. 3 to be described later. When the signal having the signal frequency fRF is transmitted to the imaging subject 10, the modulated light passing through the electro-optical crystal 11 is subjected to the modulation of the signal frequency fRF. The detection light, which is the modulated light subjected to the modulation of the signal frequency fRF, is output to the CMOS image sensor 41 through one part of the polarizing optical system and the imaging lens 59, as described above. The detection light caused to enter the CMOS image sensor 41 contains, in addition to the frequency component of the light modulation frequency fLO and the signal frequency fRF, an intermediate frequency component having a frequency component |fLO−fRF|.

The intermediate frequency component having the frequency component of |fLO−fRF| is generated in the detection light by the ¼ wavelength plate 53, the ½ wavelength plate 54, the polarization beam splitter 55, the ¼ wavelength plate 56, and the ½ wavelength plate 57, as described above. The modulated light, which has been obtained through modulation at the frequency fLO and has exited from the fiber end 51, has the polarization state and the signal intensity adjusted with the ¼ wavelength plate 53, the ½ wavelength plate 54, and the polarization beam splitter 55, and is converted to the elliptically polarized light by the ¼ wavelength plate 56 and the ½ wavelength plate 57, and thereafter, subjected to the phase modulation of the frequency fRF in the electro-optical crystal 11. According to such phase modulation, the detection light contains the component of the elliptically polarized light having the frequency component of |fLO−fRF|, which is the differential frequency component, and having the phase-modulated component. The detection light containing the component of the elliptically polarized light is converted to the polarization component having the frequency component of |fLO−fRF| by the ½ wavelength plate 57, the ¼ wavelength plate 56, and the polarization beam splitter 55, and detected with the CMOS image sensor 41 through the imaging lens 59. At this time, the polarizing optical system and the electro-optical crystal 11 have a function of a multiplier with respect to the transmitting signal of the signal frequency fRF and the modulated light of the light modulation frequency fLO, and operate as a mechanism of generating the intermediate frequency component of |fLO−fRF|, which is the differential frequency of the signal frequency fRF and the light modulation frequency fLO.

Thus, the intermediate frequency component of an arbitrary |fLO−fRF| can be created by adjusting the light modulation frequency fLO with respect to the signal frequency fRF to observe. The intermediate frequency component of |fLO−fRF| contains the electric field information of the imaging subject 10. The imaging control system 40 can obtain the two-dimensional image including the electric field information of the imaging subject 10 and display the same on the display device by adjusting the intermediate frequency component of |fLO−fRF| to a relatively low frequency.

The electromagnetic field imaging device 1 includes a table 5, a table supporting shaft 6, and a position elevation angle adjusting device 7. The imaging subject 10 is mounted on the table 5. The table supporting shaft 6 is a member for supporting the table 5. The table 5 is fixed on one end side of the table supporting shaft 6. The other end of the table supporting shaft 6 is connected to the position elevation angle adjusting device 7. The position elevation angle adjusting device 7 is placed on a floor surface 8.

The position elevation angle adjusting device 7 is a device for adjusting the position of the table 5 (furthermore, the position of the imaging subject 10) and the elevation angle of the table 5. The position elevation angle adjusting device 7 is configured to be able to move the table supporting shaft 6 individually in three-axes directions, an x-axis direction, a y-axis direction, and a z-axis direction. That is, the position elevation angle adjusting device 7 can move the imaging subject 10 mounted on the table 5 in the three axes directions independently.

Furthermore, the position elevation angle adjusting device 7 can turn the table supporting shaft 6 about the x-axis and about the y-axis, respectively, with the other end side as the center. When the table supporting shaft 6 is turned about the x-axis, the table 5 is also turned about the x-axis accompanying the same, and when the table supporting shaft 6 is turned about the y-axis, the table 5 is also turned about the y-axis accompanying the same.

An angle formed by the mounting surface, on which the imaging subject 10 is mounted, in the table 5 and the opposing surface, which is a surface facing the imaging subject 10 of the plate surfaces of the electro-optical crystal 11, is defined as an elevation angle. Furthermore, in the elevation angle, an angular component about the x-axis is referred to as an x-axis elevation angle, and an angular component about the y-axis is referred to as a y-axis elevation angle.

The x-axis elevation angle changes when the table 5 is turned about the x-axis, and the y-axis elevation angle changes when the table 5 is turned about the y-axis.

In order to image the electric field from the wiring pattern 100 laid on the circuit board with high precision over the entire wiring pattern 100, the plate surface of the circuit board where the wiring pattern 100 is laid and the opposing surface of the electro-optical crystal 11 are desirably made parallel. That is, the elevation angle is desirably 0 degree.

The electromagnetic field imaging device 1 of the present embodiment is configured such that the mounting surface of the table 5 and the opposing surface of the electro-optical crystal 11 are parallel in the initial state. Thus, in design, the plate surface of the imaging subject 10 and the opposing surface of the electro-optical crystal 11 are parallel in the initial state. Actually, however, when the imaging subject 10 is mounted on the table 5, cases where the plate surface of the imaging subject 10 and the opposing surface of the electro-optical crystal 11 are not parallel due to various reasons can be predicted.

In the present embodiment, on the other hand, the position elevation angle adjusting device 7 is configured so that the elevation angle can be adjusted by turning the table 5 about the x-axis and the y-axis. Thus, even if the plate surface of the imaging subject 10 and the opposing surface of the electro-optical crystal 11 are not parallel, adjustment can be made by the position elevation angle adjusting device 7 so that the elevation angle about the x-axis and the y-axis becomes 0 degree.

Figure 2:
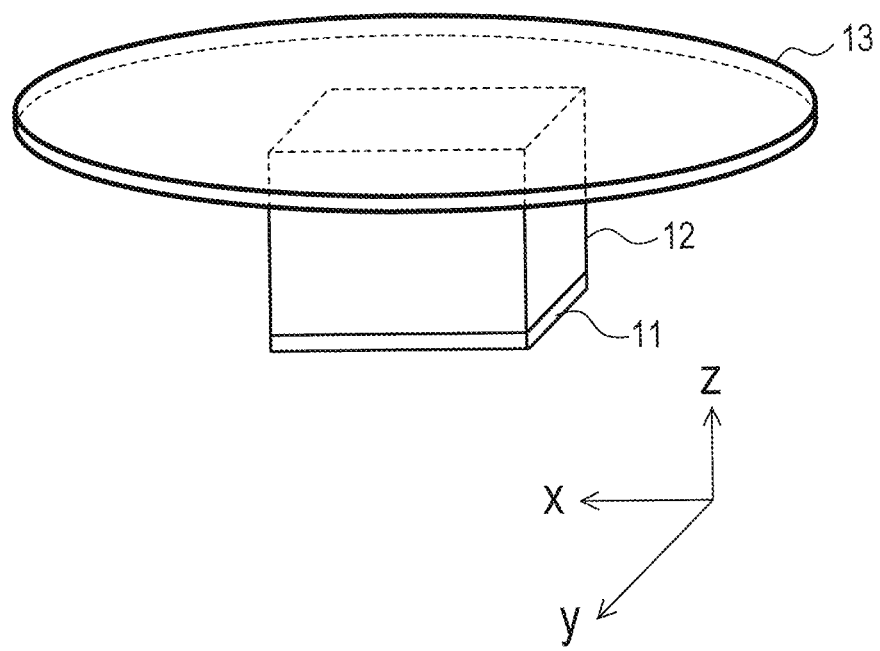
FIG. 2 is a perspective view showing an outline of a supporting structure of an electro-optical crystal.
Figure 3:
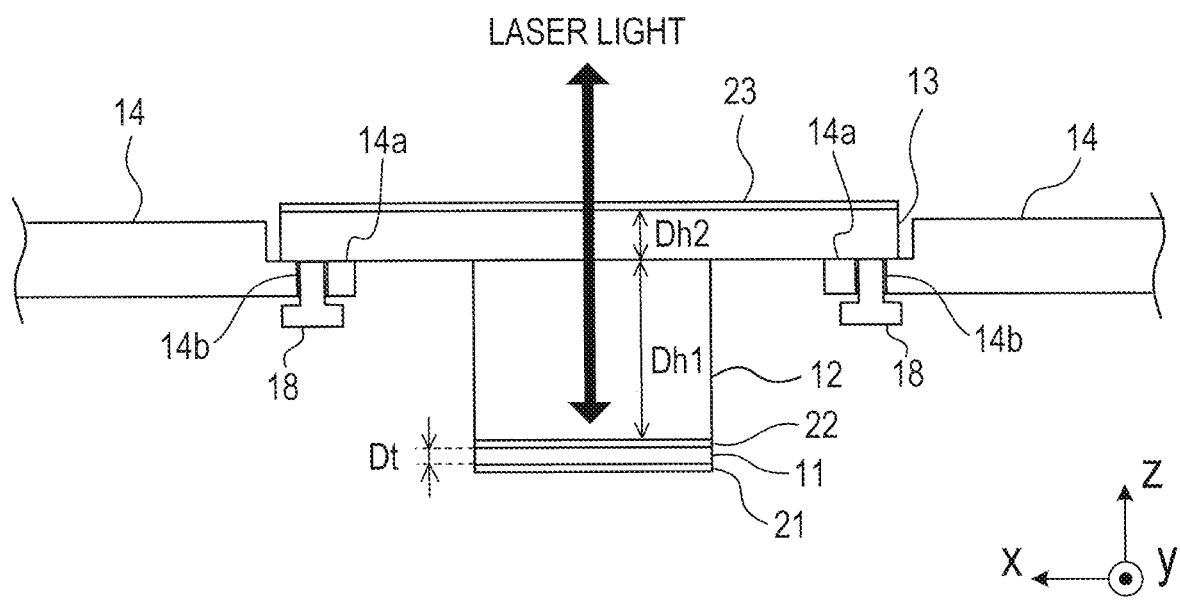
FIG. 3 is a side view showing details of the supporting structure of the electro-optical crystal.

As shown in FIGS. 1 and 2, the electro-optical crystal 11 is supported by a first supporting glass 12 on an incident surface side on the side opposite the opposing surface of the plate surfaces. The first supporting glass 12 is supported by a second supporting glass 13. As shown in FIGS. 1 and 3, the second supporting glass 13 is mounted on a holder bottom plate 14 having a hollow circular plate shape.

More specifically, as shown in FIG. 3, the reflection film 21 that reflects the modulated light from the laser light source 43 is arranged on the opposing surface of the electro-optical crystal 11. The modulated light that has entered the electro-optical crystal 11 is reflected by the reflection film 21 without being transmitted toward the imaging subject 10 side, and then caused to exit in the entering direction.

Furthermore, an anti-reflection film 22 for suppressing the reflection of the modulated light from the laser light source 43 is arranged on the incident surface of the electro-optical crystal 11. As shown in FIG. 3, the electro-optical crystal 11 is attached to the first supporting glass 12 by way of the anti-reflection film 22. Furthermore, an anti-reflection film 23 for suppressing the reflection of the modulated light from the laser light source 43 is also arranged on the upper surface of the second supporting glass 13. Although not illustrated, if the modulated light is reflected at a boundary of the first supporting glass 12 and the second supporting glass 13 when the first supporting glass 12 and the second supporting glass 13 are integrated, the anti-reflection film may be arranged at the boundary of the first supporting glass 12 and the second supporting glass 13.

The holder bottom plate 14 is configured to be attachable to and detachable from a holder main body 15. FIG. 1 shows a state in which the holder bottom plate 14 is attached to the holder main body 15. Furthermore, the object lens 16 is screwed and fixed to the holder main body 15.

The holder bottom plate 14 and the holder main body 15 are made from a non-metal raw material such as nylon. The material of the holder bottom plate 14 and the holder main body 15 is desirably an insulating body, and more specifically, an insulating body in which an electric permittivity is as small as possible to maintain low invasiveness at the time of imaging the electric field.

When imaging the magnetic field using the magneto-optical crystal as the polarizing optical member, the raw material of the holder bottom plate 14 and the holder main body 15 is preferably a non-magnetic body. The low invasiveness can be ensured even at the time of imaging the magnetic field by adopting the non-magnetic body for the raw material of the holder bottom plate 14 and the holder main body 15. Nylon is an insulating body and also a non-magnetic body. Thus, the bottom plate 14 and the holder main body 15 made of nylon can be used for both electric field imaging and magnetic field imaging.

Figure 4:
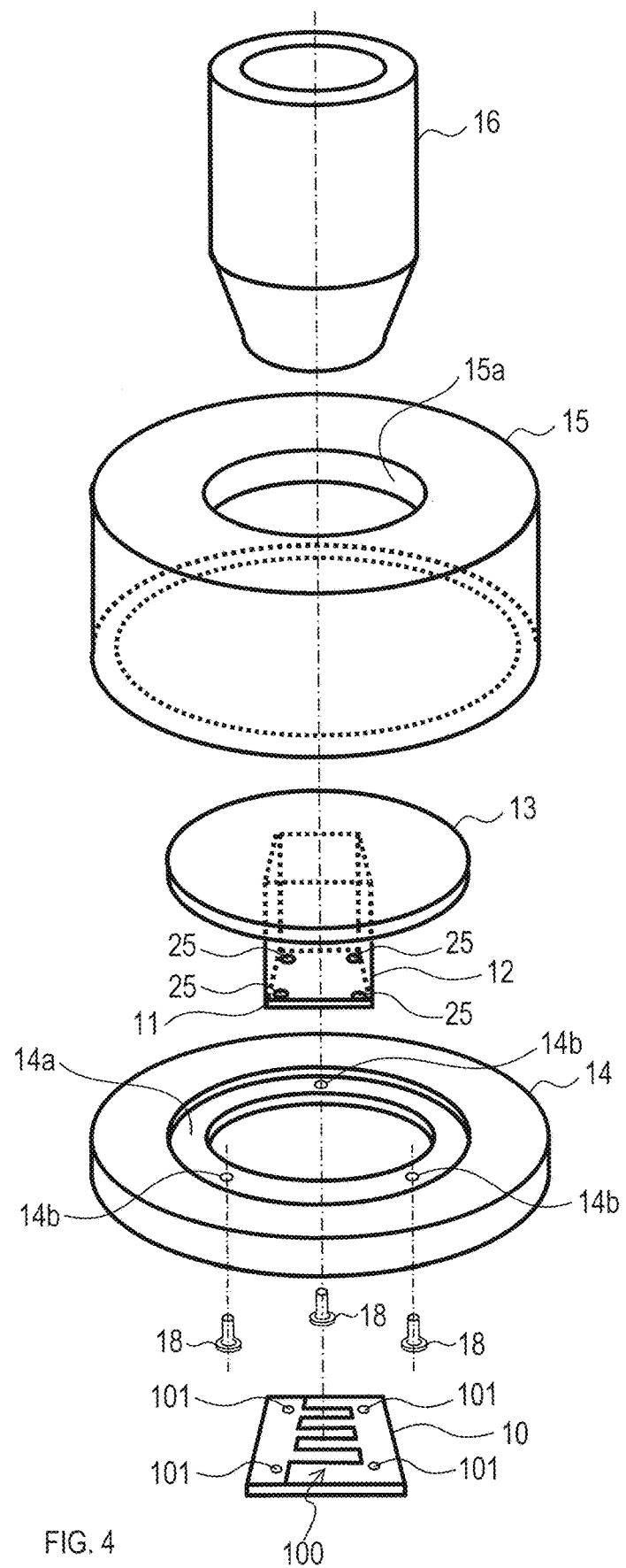
FIG. 4 is a perspective view showing a supporting structure of a crystal unit including the electro-optical crystal.

As shown in FIG. 4, the holder main body 15 has a cylindrical shape as a whole. The holder main body 15 is formed with a supporting hole 15a for supporting the object lens 16 at a central part of the upper surface. A thread groove is formed on an inner peripheral surface of the supporting hole 15a. Furthermore, a screw thread (not shown) is formed on an outer periphery of the object lens 16. Thus, the object lens 16 is fixed to the holder main body 15 by screw-fitting the object lens 16 in the supporting hole 15a.

As shown in FIG. 4, the holder main body 15 is configured such that the lower surface side is opened, and the holder bottom plate 14 is attachable to and detachable from the lower surface side of the holder main body 15. The holder bottom plate 14 has a hollow circular plate shape. As shown in FIGS. 3 and 4, the holder bottom plate 14 is formed with a supporting recess 14a for supporting an outer peripheral end of the second supporting glass 13.

The second supporting glass 13 is not securely attached to the holder bottom plate 14, and is simply supported while being mounted in the supporting recess 14a of the holder bottom plate 14. That is, one structural object (hereinafter referred to as "crystal block") including the electro-optical crystal 11, the first supporting glass 12, and the second supporting glass 13 is not securely attached to the holder bottom plate 14, and is simply supported while being mounted in the supporting recess 14a of the holder bottom plate 14.

Thus, when the crystal block is mounted on the holder bottom plate 14, the movement of the crystal block in the x-axis direction and the y-axis direction is substantially regulated, but the movement of the crystal block toward the upper side in the z-axis direction (upward direction in FIG. 4) is not regulated. That is, the crystal block can separate and move toward the upper side in the z-axis direction from the holder bottom plate 14 when an external force toward the upper side in the z-axis direction is applied to the crystal block.

In FIGS. 1, 2, and 4, the illustration of the reflection film 21 and each anti-reflection film 22, 23 shown in FIG. 3 is omitted.

As shown in FIGS. 1, 3, and 4, three screw holes 14b are formed in the supporting recess 14a of the holder bottom plate 14 so as to pass through the supporting recess 14a in a perpendicular direction. Specifically, in the supporting recess 14a having a hollow circular plate shape, the three screw holes 14b are formed at a specified angle interval (e.g., 120 degrees interval) in the peripheral direction.

A screw 18 is screwed into the three screw holes 14b from the lower surface side of the supporting recess 14a. The length of the screw shaft of each screw 18 is longer than the thickness in the perpendicular direction of the supporting recess 14a. Thus, when the screw 18 is completely screwed into the screw hole 14b, a distal end of the screw 18 projects out from the upper surface of the supporting recess 14a by a constant length.

The projection amount of the screw 18 from the upper surface of the supporting recess 14a can be individually adjusted for every screw 18, and may be zero. When the screw 18 is projected out from the upper surface of the supporting recess 14a, the distal end of the screw 18 is brought into contact with the second supporting glass 13, so that the screw 18 lifts up the second supporting glass 13 from the upper surface of the supporting recess 14a.

Thus, the tilt of the second supporting glass 13 (furthermore, the tilt of the electro-optical crystal 11) is adjusted as the projection amount of the screw 18 from the upper surface of the supporting recess 14a is individually adjusted for every screw 18. The position relationship of the electro-optical crystal 11 and the optical system thus can be adjusted. In other words, fine adjustment can be made such that the modulated light perpendicularly enters the electro-optical crystal 11.

In the present embodiment, an example in which the three screw holes 14b are formed in the holder bottom plate 14 has been shown, but the number of screw holes 14b is not limited to three. The number of the screw holes and the position of the screw holes are not particularly limited as long as a horizontal adjustment of the electro-optical crystal 11, that is, the adjustment for causing the modulated light to perpendicularly enter the plate surface of the electro-optical crystal 11 can be appropriately carried out.

A crystal side marker 25 of a specified shape (e.g., circular) is added to each of the four corners of the opposing surface in the electro-optical crystal 11, as shown in FIG. 4. On the other hand, a subject side marker 101 of a specified shape (e.g., circular) is also added to each of the four corners of the circuit board constituting the imaging subject 10. The crystal side marker 25 and the subject side marker 101 each are added to positions that do not overlap in the z-axis direction at the time of imaging. As will be described later, the markers 25, 101 are used when carrying out a close attachment parallelism adjustment for closely attaching the electro-optical crystal 11 and the imaging subject 10 in a parallel state.

The dimension in the perpendicular direction (z-axis direction) of the electro-optical crystal 11 and each supporting glass 12, 13 configuring the crystal block will be described with reference to FIG. 3. In the present embodiment, a dimension Dh1 in the perpendicular direction of the first supporting glass 12 is, for example, 3 mm, and a dimension Dh2 in the perpendicular direction of the second supporting glass 13 is, for example, 1 mm.

Furthermore, a crystal thickness Dt, which is the dimension in the perpendicular direction of the electro-optical crystal 11, is, for example, 0.01 mm. A minimum void interval Dgm, which is a smallest interval of intervals Dgi (see FIG. 7) between adjacent patterns in the wiring pattern 100 of the imaging subject 10, is, for example, 0.01 mm.

In the present embodiment, the crystal thickness Dt of the electro-optical crystal 11 is set within a range of no larger than 1.2 times the minimum void interval Dgm of the imaging subject 10. That is, if the minimum void interval Dgm of the imaging subject 10 is 0.01 mm, for example, the crystal thickness Dt of the electro-optical crystal 11 is set within a range of smaller than or equal to 0.012 mm. In other words, when the minimum void interval Dgm of the imaging subject 10 is assumed as minimum resolution of the imaging subject 10, the crystal thickness Dt of the electro-optical crystal 11 needs to be set within a range of no larger than 1.2 times the minimum resolution of the imaging subject 10. Thus, in the present embodiment, higher resolution of the electric field distribution obtained as an imaging result is realized by having the electro-optical crystal 11 have a thin plate shape with the minimum void interval Dgm of the imaging subject as a reference (i.e., minimum resolution as a reference).

As shown in FIG. 1, the electromagnetic field imaging device 1 also includes a configuration for optically photographing the imaging subject 10 in the z-axis direction. Specifically, the electromagnetic field imaging device 1 includes an LED illumination 30, a diaphragm 31, a lens 32, a half mirror 33, and a camera 35. The LED illumination 30 emits light for illuminating the imaging subject 10.

The light emitted from the LED illumination 30 is delivered onto the electro-optical crystal 11 through the diaphragm 31, the lens 32, the half mirror 33, the dichroic mirror 58, the object lens 16, and each supporting glass 12, 13. Furthermore, the light is transmitted through the electro-optical crystal 11 to reach the imaging subject 10. The reflection film 21 does not function as a reflection film with respect to the wavelength band of the light from the LED illumination 30. Thus, the light from the LED illumination 30 is transmitted through the reflection film 21 to reach the imaging subject 10.

Thus, the imaging subject 10 can be visually recognized through the object lens 16, and the image of the imaging subject 10 is photographed with the camera 35 through the half mirror 33. The image data photographed with the camera 35 is input to the imaging control system 40. The imaging control system 40 can display an image of the imaging subject 10 photographed with the camera 35 on a display device based on the image data input from the camera 35. Furthermore, the imaging control system 40 can superimpose an electric field video or a magnetic field video imaged with the CMOS image sensor 41 on the optical image photographed with the camera 35 to display on the display device.

As shown in FIG. 4, the crystal side marker 25 is added to each of the four corners of the opposing surfaces in the electro-optical crystal 11, and the subject side marker 101 is added to each of the four corners of the circuit board constituting the imaging subject 10. Such markers 25, 101 may be photographed with the camera 35 and displayed for checking.

In the present embodiment, the position of the electro-optical crystal 11 is adjusted so that the four crystal side markers 25 of the electro-optical crystal 11 are all displayed on the display device in a focused state when the electro-optical crystal 11 is photographed with the camera 35. Thus, when an image in which the four subject side markers 101 of the imaging subject 10 are all focused is obtained when photographed with the camera 35, the electro-optical crystal 11 and the imaging subject 10 can be said as being in a closely attached state or a slightly separated state and in a parallel state.

On the other hand, when the four crystal side markers 25 of the electro-optical crystal 11 are all in a focused state but at least one of the four subject side markers 101 of the imaging subject 10 differs from the other subject side markers in the focusing manner, the electro-optical crystal 11 and the imaging subject 10 can be said as not being in a parallel state or a spaced distance between the electro-optical crystal 11 and the imaging subject 10 being large.

In the present embodiment, the user can carry out the close attachment parallelism adjustment of the electro-optical crystal 11 and the imaging subject 10 while photographing and checking the focusing manner of each marker 25, 101 with the camera 35. Specifically, the user can have the electro-optical crystal 11 and the imaging subject 10 in a closely attached state in a parallel state by bringing the imaging subject 10 closer to the electro-optical crystal 11 with the position elevation angle adjusting device 7 so that each crystal side marker 25 and each subject side marker 101 are all in a focused state in the photographed image of the camera 35. The user can also carry out focus adjustment even with the imaged image by the CMOS image sensor 41 by using the CMOS image sensor 41 as an optical photographing mode in place of the camera 35.

The operation of the position elevation angle adjusting device 7 may, for example, be controlled by a direction operation on the position elevation angle adjusting device 7. Furthermore, for example, the position elevation angle adjusting device 7 and the imaging control system 40 may be electrically connected, so that the imaging control system 40 may automatically control the position elevation angle adjusting device 7 by automatically determining a degree of coincidence of the foci of each crystal side marker 25 on the lower surface of the electro-optical crystal 11 and each subject side marker 101 of the imaging subject 10 from the photographed image of the camera 35.

Furthermore, the number, shape, position, and the like of the crystal side marker 25 to be added to the opposing surface may be appropriately determined in the electro-optical crystal 11. The number, shape, position, and the like of the subject side marker 101 of the imaging subject 10 may also be appropriately determined.

(2) Supplementary Explanation Related to Resolution of Entire Optical System

Figure 5:
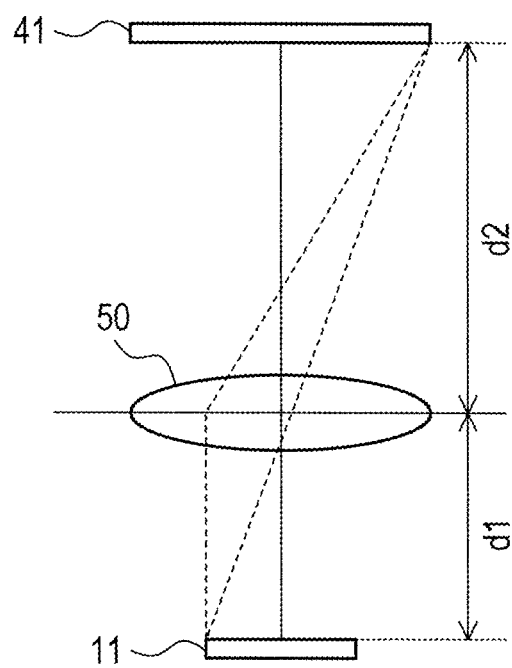
FIG. 5 is an optical model in which a configuration of an optical system interposed between the electro-optical crystal and a CMOS image sensor is schematically simplified as one lens.

The resolution of the electromagnetic field imaging device 1 of the present embodiment will now be given a supplementary explanation using FIGS. 5 and 6. FIG. 5 is an optical model in which a configuration of an optical system interposed between the electro-optical crystal 11 and a CMOS image sensor 41 is schematically simplified as one lens 50.

Figure 6:
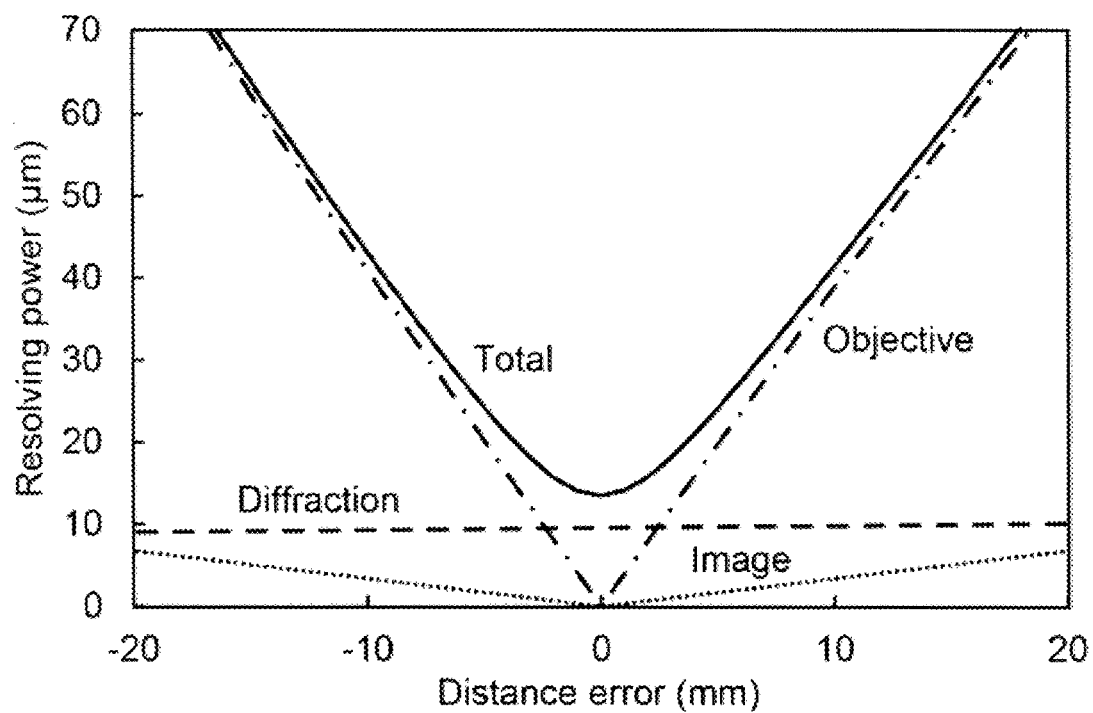
FIG. 6 is an explanatory view describing theoretical resolution of the optical model of FIG. 5.

The theoretical resolution of the optical model is shown in FIG. 6. In FIG. 6, the horizontal axis indicates an optical path deviation in a case where the optical path of the optical system is deviated from an ideal state. A point of zero on the horizontal axis means a state in which the optical system is bonded in an ideal optical path. A vertical axis of FIG. 6 indicates resolution of the optical system.

In FIG. 6, a broken line denoted as "Diffraction" indicates a diffraction limit, and is, for example, 0.61 $\lambda$/NA in the present embodiment. In the optical system in the electromagnetic field imaging device 1 of the present embodiment shown in FIG. 1, the diffraction limit is about 10 μm. Defocus, that is, misalignment of focus is proportional to the deviation (chain dashed line denoted as "Objective" in FIG. 6) of a distance d1 from the lens 50 to the electro-optical crystal 11, and is also proportional to a deviation (dotted line denoted as "Image" in FIG. 6) of an image distance d2 from the lens 50 to the image sensor 41. In this case, the deviation of d1 is more dominant than the deviation of d2. The resolution of the entire optical system becomes a synthesis of the three (i.e., synthesis of three properties of broken line, chain dashed line, and dotted line), and is shown with a solid line in the figure. As apparent from the figure, the deviation of the distance d1 is the most dominant in the resolution of the entire optical system.

In the electromagnetic field imaging device 1 of the present embodiment, the entire optical system from the laser light source 43 to the CMOS image sensor 41 through various types of optical elements and lenses has sufficient resolution and precision for imaging the electromagnetic field from the imaging subject 10. In other words, a state in which the deviation of the distance is substantially zero (i.e., horizontal axis is zero or close to zero) in FIG. 6 is obtained.

(3) Electric Field Imaging Example

Figure 7:
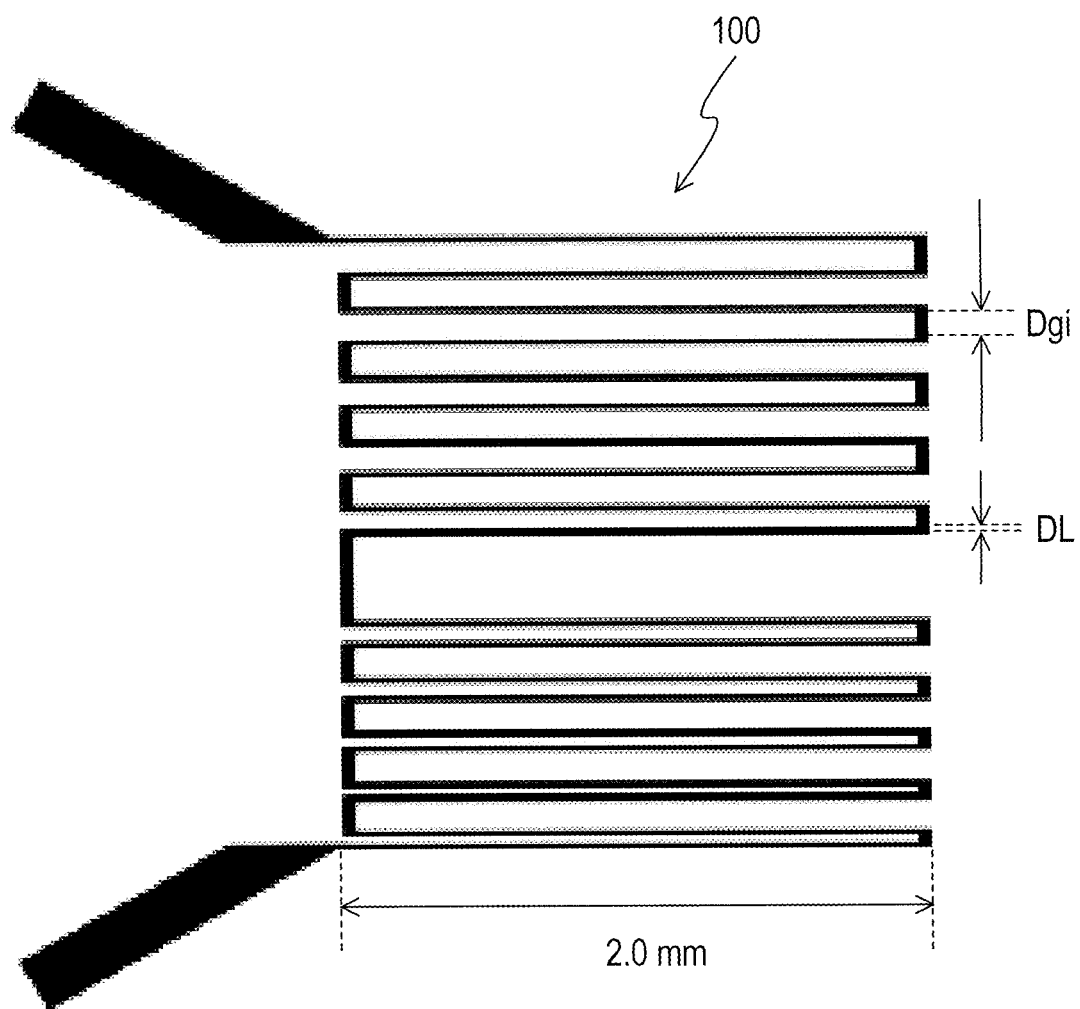
FIG. 7 is an explanatory view showing a wiring pattern of an imaging subject.
Figure 8:
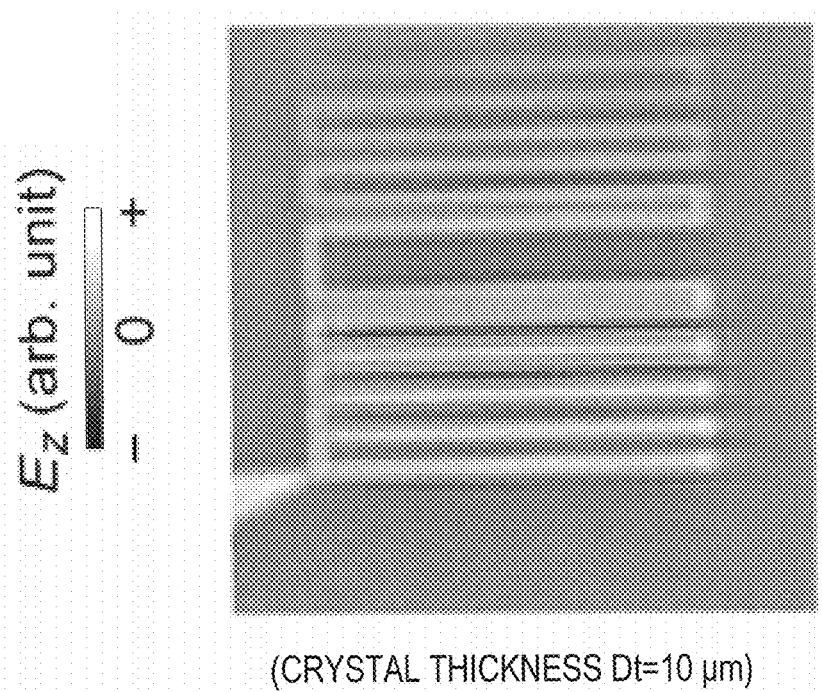
FIG. 8 is an explanatory view showing one example of an electric field imaging result of the first embodiment.

FIG. 8 shows one example of a result of imaging an electric field distribution from the imaging subject 10 using the electromagnetic field imaging device 1 of the present embodiment. FIG. 8 shows an imaging result in a case where imaged using the electro-optical crystal configured to be able to image only the z-axis direction electric field component. FIG. 8 shows one example of the electric field imaging result in a case where a transmitting signal is supplied to the wiring pattern 100 shown in FIG. 7.

When carrying out imaging, the close attachment parallelism adjustment is carried out, as described above, before the start of imaging to obtain a state in which the electro-optical crystal 11 is made parallel to and closely attached to the imaging subject 10.

As shown in FIG. 7, the wiring pattern 100 formed on the imaging subject 10 has a configuration in which the wiring with a wire width of DL=10 μm is laid at an interval of Dgi while being folded back by 2.0 mm. The minimum void interval Dgm, which is the minimum value of the intervals Dgi between the adjacent wires, is 10 μm. The result of FIG. 8 is the result in a case where the electro-optical crystal 11 in which the crystal thickness Dt is 10 μm is used.

FIG. 8 shows that the electric field intensity becomes weaker the darker the light-dark, and the electric field intensity becomes stronger the lighter the light-dark. As apparent from FIG. 8, the electric field distribution immediately above the wiring pattern 100 is observed with high resolution along the wiring pattern 100.

Figure 9:
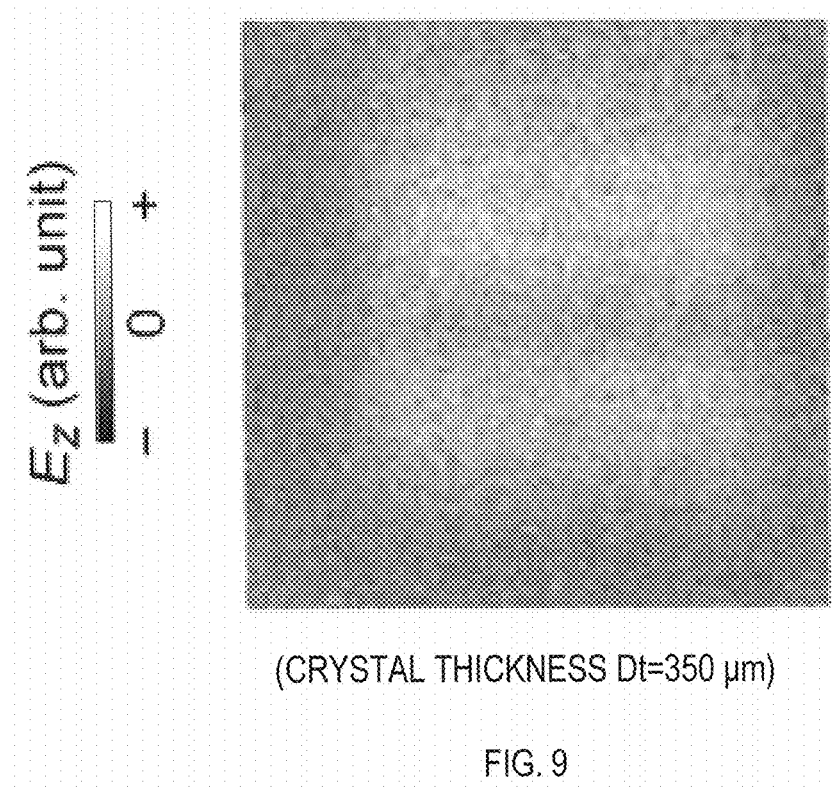
FIG. 9 is an explanatory view showing one example of an electric field imaging result for comparison.

FIG. 9 shows one example of an imaging result in a case where the electro-optical crystal in which the crystal thickness Dt is as thick as 350 μm is used for comparison. As apparent from FIG. 9, when the crystal thickness Dt is relatively large with respect to the minimum void interval Dgm of the wiring pattern 100, the result of not only the electric field immediately above the wiring pattern, but of accumulation to the electric field at the upper part in the z-axis direction is observed, and hence the electric field distribution immediately above the wiring pattern 100 cannot be obtained with satisfactory precision.

Figure 10:
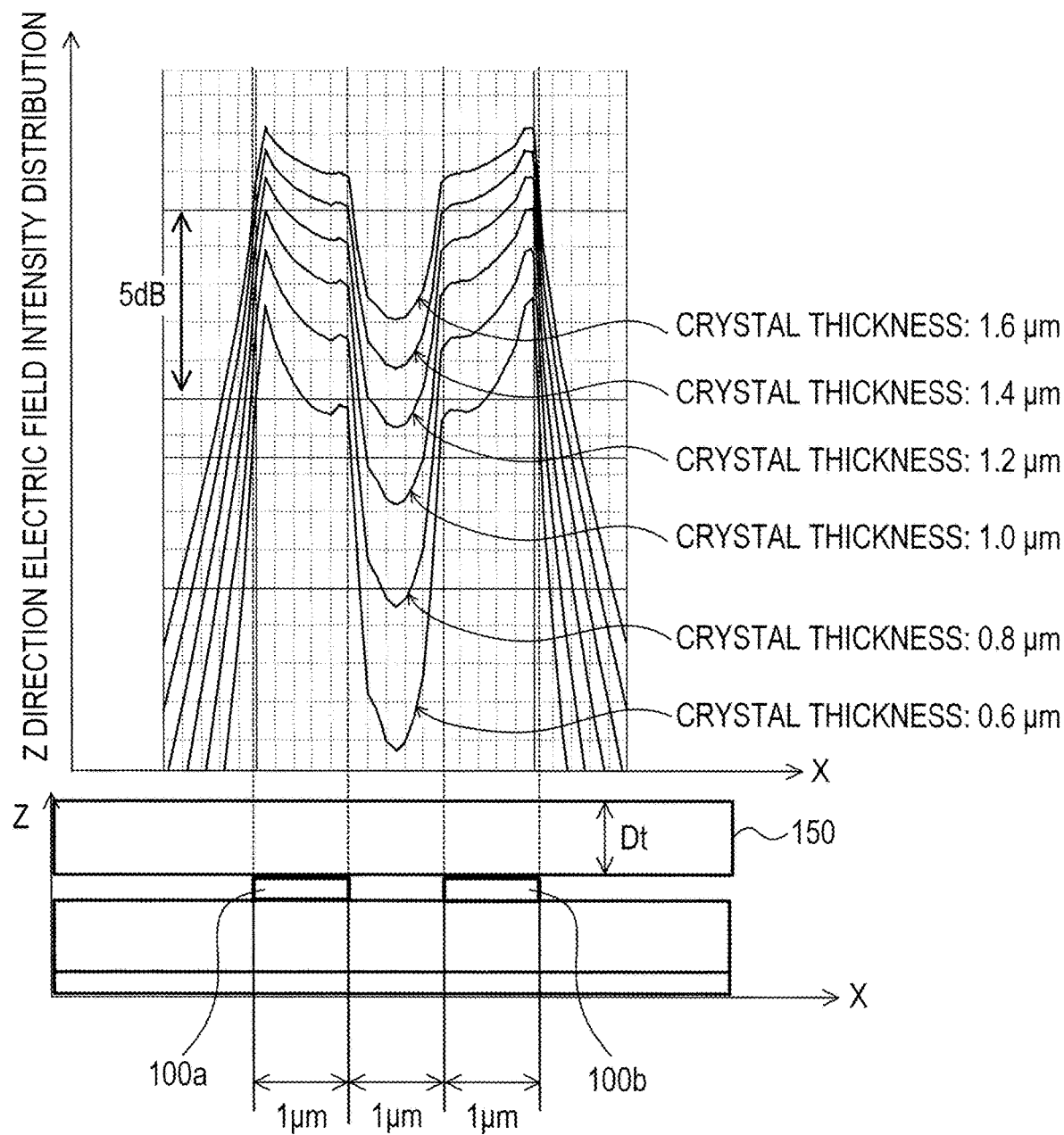
FIG. 10 is an explanatory view showing that a performance in which the electric field from the adjacent wiring is resolved depends on a crystal thickness Dt.

(4) Relationship of Crystal Thickness Dt and Resolution of Electric Field of Adjacent Wirings The relationship of the crystal thickness Dt and the void interval of the wirings will now be given a supplementary explanation using FIG. 10. As shown in FIG. 10, an imaging subject including two wirings 100a, 100b travelling in parallel is prepared as an imaging subject for verification of the crystal thickness Dt. An electro-optical crystal 150 of the crystal thickness Dt is arranged on the imaging subject. The wire width of the two wirings 100a, 100b is 1 μm, and an interval (i.e., void interval) between the wirings 100a, 100b is 1 μm.

FIG. 10 shows an example of simulating a distribution of the respective z-axis direction electric field components in a case where the crystal thickness Dt of the electro-optical crystal 150 is changed to six different types. FIG. 10 shows an imaging result in a case where an in-phase transmitting signal is applied to each wiring 100a, 100b. The crystal thickness Dt necessary for separating and detecting the electric field intensity of both wirings 100a, 100b travelling in parallel at equal interval is verified based on the result of FIG. 10.

When the in-phase transmitting signal is applied to each wiring 100a, 100b, the electric field intensity on each wiring 100a, 100b is changed in phase. When the crystal thickness Dt becomes thick, not only the electric field immediately above each wiring 100a, 100b, but even the electric field spread to a space further on the upper side in the z-axis direction than immediately above each wiring 100a, 100b is detected. Thus, when the crystal thickness Dt becomes thick, the signal strength ratio by the presence or absence of wiring cannot be sufficiently obtained.

In order to detect the electric field from each wiring 100a, 100b individually with satisfactory precision, the detection value of the electric field intensity at a central part in a gap region between the wirings 100a, 100b is desirably smaller than or equal to a half of the detection value of the electric field intensity of each wiring 100a, 100b. In the example of FIG. 10, the detection value of the electric field intensity at the central part of the gap region becomes smaller than or equal to a half of the detection value of the electric field intensity of each wiring 100a, 100b when the crystal thickness Dt is smaller than or equal to 1.2 μm.

That is, when the void interval of the wiring is 1 μm, the crystal thickness Dt is preferably smaller than or equal to 1.2 μm. Thus, the crystal thickness Dt is preferably no larger than 1.2 times the minimum void interval Dgm in the imaging subject, and more preferably, smaller than or equal to the minimum void interval Dgm.

(5) Effects of First Embodiment

According to the first embodiment described above, the electro-optical crystal 11 is configured to be relatively movable in the perpendicular direction with respect to the imaging subject 10. That is, the electromagnetic field imaging device 1 has a structure in which when being brought proximate to the imaging subject 10 and brought into contact with the imaging subject 10 to receive an external force in the z-axis direction from the imaging subject 10, the electro-optical crystal 11 can move in the direction of the external force. Thus, even if the electro-optical crystal 11 and the imaging subject 10 are brought into contact when relatively closely attaching the same, breakage of the electro-optical crystal 11 by such contact can be suppressed.

Furthermore, the crystal thickness Dt, which is the plate thickness of the electro-optical crystal, is no larger than 1.2 times the minimum void interval Dgm of the wiring, and thus the electromagnetic field distribution from the imaging subject including the wiring can be imaged with high resolution and low invasiveness, and the imaging result can be displayed. In particular, in the present embodiment, the imaging result can also be displayed as a moving image in addition to being displayed as a still image. Thus, the time-series change of the electromagnetic field can be observed with high precision.

Furthermore, in the first embodiment, the electro-optical crystal 11 is supported by each supporting glass 12, 13 and the second supporting glass 13 is supported by a nonmetal (nylon in the present embodiment) holder bottom plate 14 and holder main body 15. That is, the electro-optical crystal 11 is supported by a material that has no influence (or small influence) on the distribution of the electric field generated from the imaging subject 10. Thus, the electromagnetic field from the imaging subject 10 can be imaged with low invasiveness.

Furthermore, the electromagnetic field imaging device 1 of the first embodiment can freely adjust the relative position relationship between the imaging subject 10 and the electro-optical crystal 11. Specifically, in the present embodiment, the table 5 can be moved in the x-axis direction, the y-axis direction, and the z-axis direction, and the x-axis elevation angle and the y-axis elevation angle can also be adjusted individually. Thus, the close attachment parallelism adjustment for closely attaching the imaging subject 10 to the electro-optical crystal 11 in a parallel state can be easily carried out.

The electromagnetic field imaging device 1 corresponds to one example of the electromagnetic field imaging device of the present disclosure. The laser light source 43 corresponds to one example of a modulated light outputter of the present disclosure. Each supporting glass 12, 13 corresponds to one example of the first supporting member of the present disclosure. The reflection film 21 corresponds to one example of a reflection member of the present disclosure. The holder bottom plate 14 corresponds to one example of the second supporting member of the present disclosure. The CMOS image sensor 41 corresponds to one example of the photoelectric convertor of the present disclosure. The imaging control system 40 corresponds to one example of the image processor of the present disclosure. The polarizing optical system corresponds to one example of the polarized light processor of the present disclosure. The position elevation angle adjusting device 7 corresponds to one example of the manipulator, the movement controller, and the movable mechanism of the present disclosure.

Second Embodiment

Other configuration examples of the electro-optical crystal will be described as a second embodiment. In the first embodiment described above, the electro-optical crystal 11 in which the same one crystal is formed to a thin plate shape is illustrated as the electro-optical crystal. In the second embodiment, an electro-optical crystal having a structure that includes a plurality of different crystals with different sensitivity directions with respect to the electric field is illustrated.

Figure 11:
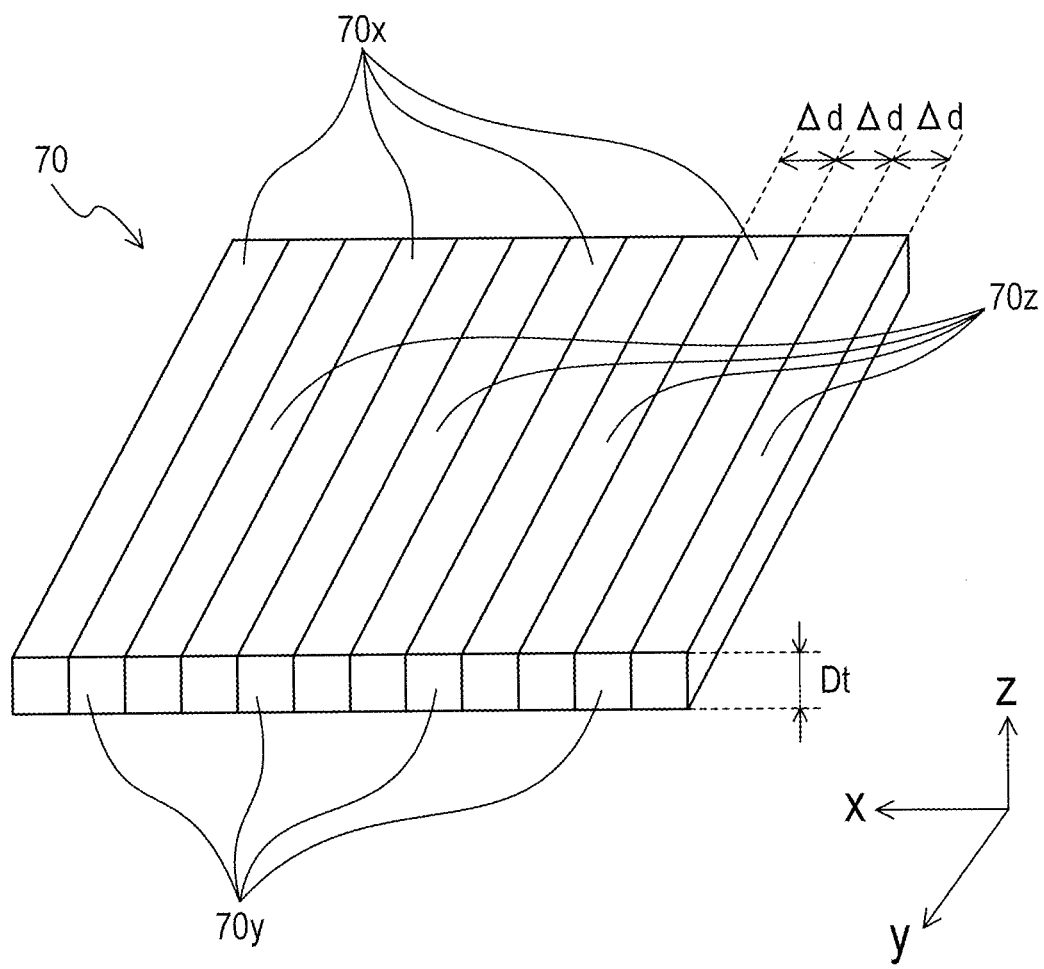
FIG. 11 is a perspective view showing a detailed structure of an electro-optical crystal of a second embodiment.

As shown in FIG. 11, an electro-optical crystal 70 of the second embodiment has a thin plate shape with square surfaces as a whole, but more specifically, has an array structure in which a plurality of crystal portions each having an elongate shape are arrayed in a strip form in the x-axis direction. Specifically, with the three crystal portions arrayed in the x-axis direction, that is, an x-axis direction crystal portion 70x, a y-axis direction crystal portion 70y, and a z-axis direction crystal portion 70z, as one unit structure, four of such unit structures are arrayed in the x-axis direction. The array structure in which four unit structures are arrayed is an example, and the shape of the strip and the array state of the electro-optical crystal 70 may be appropriately combined according to a region to image. For example, the shape of the strip may be changed or strips of different shapes may be combined, or the material of different properties such as electro-optical crystal and magneto-optical crystal may be combined according to the imaging subject.

The dimensional shapes of each crystal portion of the x-axis direction crystal portion 70x, the y-axis direction crystal portion 70y, and the z-axis direction crystal portion 70z are the same. The length in the x-axis direction of each crystal portion 70x, 70y, 70z is referred to as a defined length $\Delta d$.

The crystal portions 70x, 70y, 70z each are all crystals of the same composition and are ZnTe, as described above, in the present embodiment, but have different sensitivity directions with respect to the electric field. In other words, the x-axis direction crystal portion 70x has the highest sensitivity with respect to the x-axis direction electric field component, which is the component in the x-axis direction, of the electric field in the x-axis direction crystal portion 70x, and has no or very low sensitivity with respect to the y-axis direction electric field component and the z-axis direction electric field component. The sensitivity referred to here is defined as B/A, which is the ratio of the electric field intensity A of the imaging subject and the amplitude B of the intensity-modulated light after PBS, that is, after passing the polarization beam splitter. The PBS is an abbreviation for "polarization beam splitter".

All the crystal portions 70x, 70y, 70z do not need to be the crystal of the same composition, and at least one of the crystal portions 70x, 70y, 70z may have a composition different from the others.

The y-axis direction crystal portion 70y has the highest sensitivity with respect to the y-axis direction electric field component, which is the component in the y-axis direction, of the electric field in the y-axis direction crystal portion 70y, and has no or very low sensitivity with respect to the x-axis direction electric field component and the z-axis direction electric field component. The z-axis direction crystal portion 70z has the highest sensitivity with respect to the x-axis direction electric field component, which is the component in the z-axis direction, of the electric field in the z-axis direction crystal portion 70z, and has no or very low sensitivity with respect to the x-axis direction electric field component and the y-axis direction electric field component.

When a crystal having high sensitivity only with respect to the x-axis direction electric field component and low sensitivity with respect to the other two axes components as a whole is used for the electro-optical crystal, for example, the electric field component in the x-axis direction can be appropriately detected but the other two axes components are less likely to be reflected on the detection light, and a result different from the actual body in which the distribution of the x-axis direction electric field component appears relatively strongly is obtained.

Thus, in the present embodiment, as shown in FIG. 11, the electro-optical crystal 70 has a structure in which the x-axis direction crystal portion 70x, the y-axis direction crystal portion 70y, and the z-axis direction crystal portion 70z are periodically arrayed in a certain direction (e.g., x-axis direction). The imaging of the imaging subject 10 using the electro-optical crystal 70 is carried out at three locations that differ by a defined length $\Delta d$ in the x-axis direction, as will be described later. The imaging results at the three locations are then synthesized so that the electric field distribution of the entire imaging subject 10 can be appropriately obtained.

Figure 12:
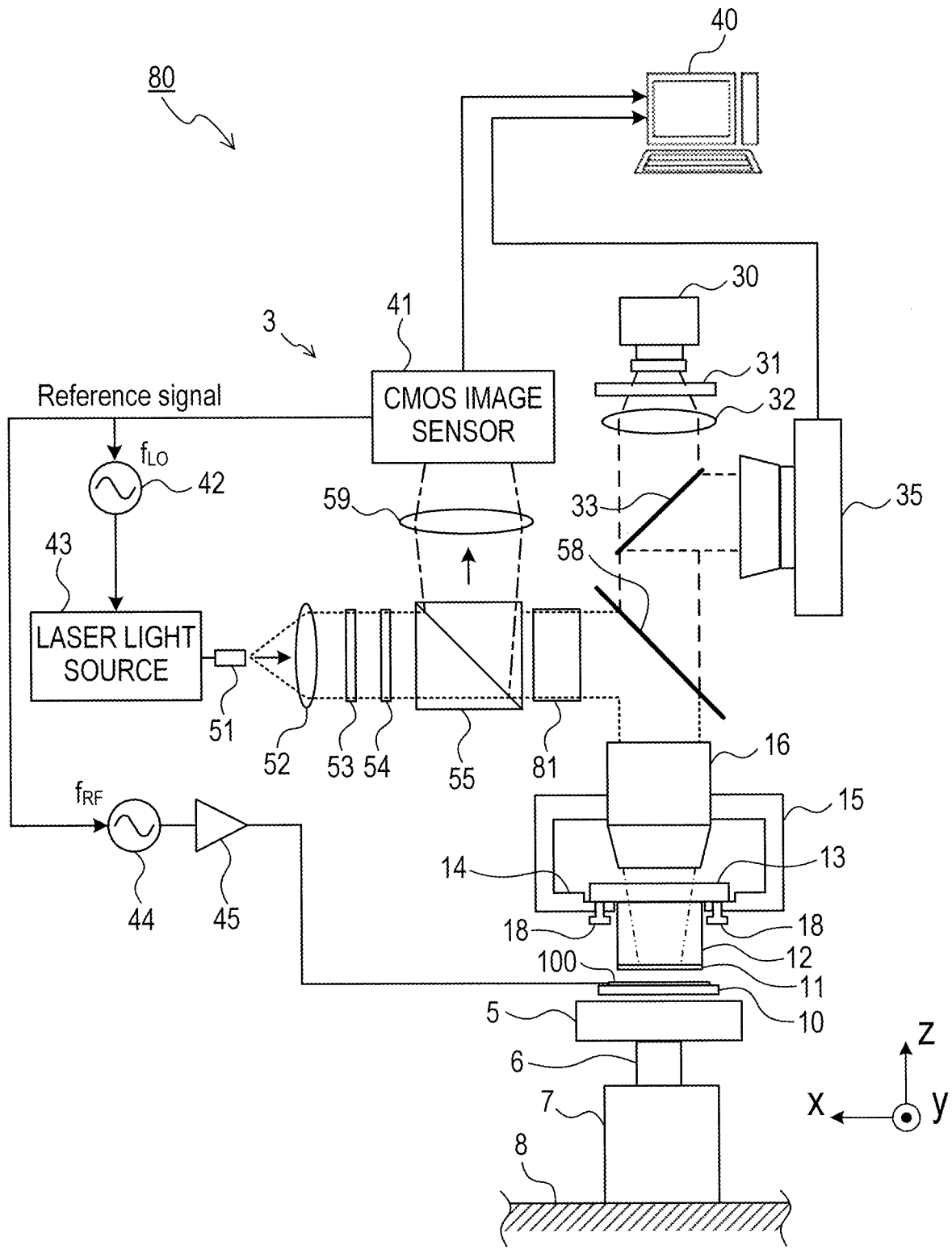
FIG. 12 is an explanatory view showing an outline of an electromagnetic field imaging device of the second embodiment.

The electromagnetic field imaging device for imaging the imaging subject 10 using the electro-optical crystal 70 of FIG. 11 is shown in FIG. 12. An electromagnetic field imaging device 80 shown in FIG. 12 differs from the electromagnetic field imaging device 1 of the first embodiment shown in FIG. 1 in that a spatial polarization controller 81 is provided in place of the ½ wavelength plate 57 and the ¼ wavelength plate 56.

The x-axis direction crystal portion 70x, the y-axis direction crystal portion 70y, and the z-axis direction crystal portion 70z of the electro-optical crystal 70 of FIG. 11 differ for every strip shape. Thus, in order to obtain the imaged image, a polarizing optical system for controlling the polarization state of the detection light for every strip region so as to be detected as a light intensity modulation signal with the CMOS image sensor 41 needs to be prepared in place of the ½ wavelength plate 57 and the ¼ wavelength plate 56 of FIG. 1. The spatial polarization controller 81 is provided to realize the above.

The spatial polarization controller 81 specifically has a structure in which different polarization controllers are arrayed for every region corresponding to the optical path of each x, y, z-axis crystal portion in the electro-optical crystal 70 in the spatial polarization controller 81. In other words, the spatial polarization controller 81 has a structure in which the polarizing optical system corresponding to the relevant crystal portion is combined for each crystal portion arrayed in the strip form.

When assuming the spatial polarization controller 81 having the above-described configuration as a fixed spatial polarization controller, a spatial polarization controller of a configuration different from the fixed spatial polarization controller may be configured. For example, the spatial polarization controller having a configuration capable of electrically controlling the polarization state with a liquid crystal element, and the like can be used. Through the use of the spatial polarization controller having such configuration, the polarization state can be adjusted for each crystal portion of an arbitrary strip shape, and hence the spatial polarization controller does not need to be replaced every time the electro-optical crystal 70 is changed to a different shape. Such a dynamic spatial polarization controller may be used.

An outline of a flow when imaging the electric field from the imaging subject 10 by the electromagnetic field imaging device 80 using the electro-optical crystal 70 of a strip shape shown in FIG. 11 will be described using FIG. 13.

Before the start of imaging, the imaging operator carries out the close attachment parallelism adjustment to obtain a state in which the electro-optical crystal 70 is made parallel to and closely attached to the imaging subject 10, as described above.

Figure 13:
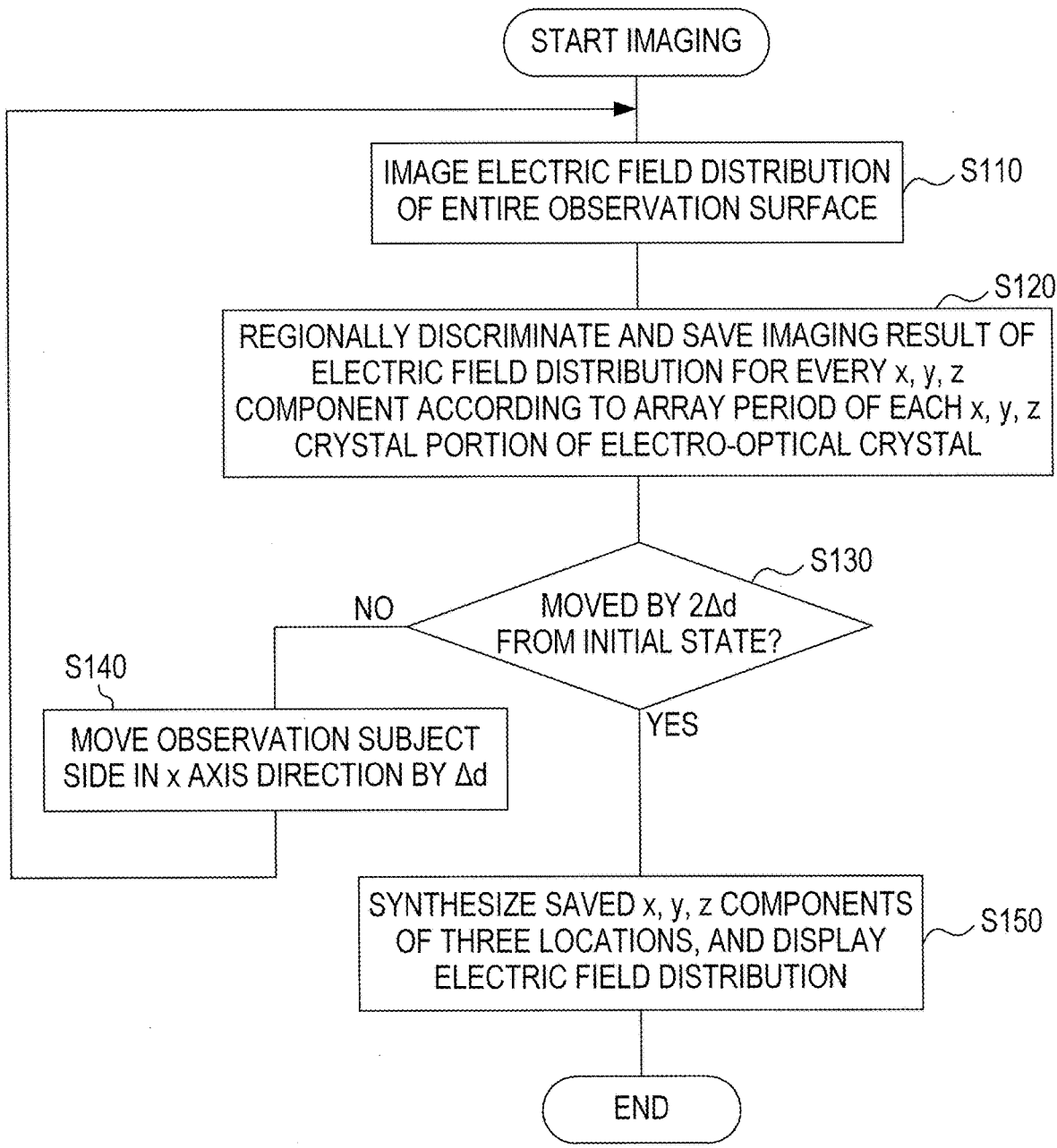
FIG. 13 is a flowchart schematically showing a flow of imaging an electric field of the second embodiment.

As shown in FIG. 13, when the imaging is started, the imaging control system 40 images the electric field distribution of the entire observation surface in the imaging subject 10 in S110. In other words, the imaging control system 40 outputs the modulated light from the laser light source 43, and images the electric field distribution of the imaging subject 10 based on the electric signal from the CMOS image sensor 41.

In S120, the imaging control system 40 discriminates and saves the electric field distribution obtained in S110 to each region of the x-axis direction electric field component, the y-axis direction electric field component, and the z-axis direction electric field component based on the array period of the x-axis direction crystal portion 70x, the y-axis direction crystal portion 70y, and the z-axis direction crystal portion 70z configuring the electro-optical crystal 70.

In S130, the imaging control system 40 determines whether or not the imaging subject 10 has been moved by a distance twice the defined length Δd from an initial state in which the first imaging is carried out in S110. When the imaging subject 10 has not yet been moved by the distance twice the defined length Δd, the position elevation angle adjusting device 7 is caused to move the imaging subject 10 in the x-axis direction by the defined length Δd in S140. The process returns to S110 after the process of S140. When the imaging subject 10 has been moved by the distance twice the defined length Δd in S130, the process proceeds to S150.

At the time point of proceeding to S150, the electric field is imaged at the position of each of the three locations that differ by Δd in the x-axis direction, and the result is saved. That is, a state in which the electric field component of each axis, x, y, z is individually obtained, is obtained in substantially the entire region of the imaging subject 10.

In S150, the imaging control system 40 synthesizes the electric field component of each axis saved at the three locations, and displays each component on the display device as the electric field distribution.

The operation effects similar to the first embodiment can be obtained even by using the electro-optical crystal 70 having the structure shown in FIG. 11.

In particular, in the second embodiment, the electro-optical crystal 70 has a structure in which each crystal portion having the maximum sensitivity in each direction x, y, z is periodically arrayed. Thus, the electric field distribution in which each electric field component of three axes are synthesized can be obtained over substantially the entire surface of the imaging subject 10 by imaging the electric field distribution while shifting in the x-axis direction by the defined length Δd, which is the array interval. An effective imaging region in the second embodiment is a region smaller than an effective imaging area in the x-axis direction in the first embodiment by 2Δd. Although the time for the movement of 2Δd is required in the measurement, the time required for the movement is very short and may be smaller than or equal to one second depending on the conditions. Thus, the imaging result can be displayed without barely any waiting time required for the measurement.

Another example of the method of imaging the electric field using the electro-optical crystal 70 of the present embodiment configured as shown in FIG. 11 will now be described. As shown in FIG. 11, the electro-optical crystal 70 of the present embodiment has a configuration in which a plurality of crystal portions having an elongate shape are arrayed in a strip form in the x-axis direction. Specifically, a configuration in which four unit structures, each including three crystal portions, that is, the x-axis direction crystal portion 70x, the y-axis direction crystal portion 70y, and the z-axis direction crystal portion 70z, are arrayed in the x-axis direction is adopted.

The defined length Δd, which is the width in the x-axis direction of each crystal portion, is a small value with respect to the resolution of the imaging optical system. The imaging is performed using the electro-optical crystal 70 in which the defined length Δd is determined in such manner. In this case, when the imaging subject area is imaged with the CMOS image sensor 41, each electric field component of the x-axis direction electric field component by the x-axis direction crystal portion 70x, the y-axis direction electric field component by the y-axis direction crystal portion 70y, the z-axis direction electric field component by the z-axis direction crystal portion 70z obtained within a region of one unit structure can be approximated as the imaging result within one unit structure.

Specifically, as the optical system, the CMOS image sensor 41 has resolution capable of sufficiently determining the defined length Δd of the strip, the correspondence of the imaging area indicating the imaging result by the x-axis direction crystal portion 70x, the y-axis direction crystal portion 70y, and the z-axis direction crystal portion 70z is carried out with respect to the imaging result. When displaying each electric field component of the x-axis, the y-axis, and the z-axis on the display device of the imaging control system 40, the resolution is dropped to a region corresponding to 3Δd or the width of one unit structure from the defined length Δd of the electro-optical crystal 70 to prepare the displaying region. Each electric field component of the x-axis, the y-axis, and the z-axis is again allocated to the displaying region at 3Δd interval, and each electric field component of the x-axis, the y-axis, and the z-axis is rebuilt to display the image. Thus, each electric field component, furthermore, an electric field vector can be imaged in a single imaging without moving the imaging subject 10.

The x-axis direction crystal portion 70x corresponds to one example of an x-axis direction optical portion of the present disclosure. The y-axis direction crystal portion 70y corresponds to one example of a y-axis direction optical portion of the present disclosure. The z-axis direction crystal portion 70z corresponds to one example of a z-axis direction optical portion of the present disclosure. The spatial polarization controller 81 and the polarization beam splitter 55 correspond to one example of a polarized light processor of the present disclosure.

Other Embodiments

The mode for carrying out the present disclosure has been described above, but the present disclosure is not limited to such embodiments, and can be variously modified and implemented.

(1) In each embodiment described above, an example using an electro-optical crystal for the polarizing optical member has been described, but the distribution of the magnetic field generated from the imaging subject 10 may be imaged by using a magneto-optical crystal in place of the electro-optical crystal. In this case as well, the two-dimensional image of the magnetic field distribution can be obtained with high resolution and low invasiveness, similarly to the time of electric field imaging.

(2) In the embodiments described above, configuration is such that the close attachment parallelism adjustment can be carried out by moving the imaging subject 10 side, but the imaging subject 10 may be fixed and the close attachment parallelism adjustment may be carried out by moving the entire optical system including the electro-optical crystal. Alternatively, both the electro-optical crystal side and the imaging subject 10 side may be moved.

Furthermore, the method of carrying out the close attachment parallelism adjustment of the electro-optical crystal and the imaging subject 10 is not limited to the method using each marker 25, 101 described above. For example, similarly to the embodiment described above, focusing may be carried out using each marker 25 for the electro-optical crystal, and focusing may be carried out using the wiring pattern 100, for example, for the imaging subject 10. In this case, determination can be made that the electro-optical crystal and the imaging subject 10 are closely attached in a parallel state if the wiring pattern 100 is photographed in a focused state as a whole. Furthermore, the close attachment parallelism adjustment may be carried out by other methods not using the marker, or other methods not using the camera 35 itself.

(3) The supporting of the electro-optical crystal by each supporting glass 12, 13 is merely an example. The electro-optical crystal may be supported by other substances that can transmit light other than glass. More specifically, the electro-optical crystal may be supported by a transparent substance, that is, other substances having a property in which the incident light is not reflected, refracted, diffracted, scattered, or the like in the substance.

(4) The plate surface shape of the polarizing optical member does not need to be a square shape. The polarizing optical member having a plate surface shape of other shapes other than the square may be used. For example, other polygonal shapes other than square may be adopted, or a circular thin plate shape may be adopted.

For the polarizing optical member configured by the plurality of crystal portions in which the sensitivity directions with respect to the electric field are different, a structure in which the crystal portion having the sensitivity direction of each of the three axes, x, y, z is periodically arrayed like the electro-optical crystal 70 shown in FIG. 11 is merely an example. How to arrange each axis crystal portion may be appropriately determined. Furthermore, it is not essential to include the crystal portions of three axes of x, y, z, and for example, only the crystal portions of any two axes may be included. Moreover, when the imaging subject merely includes only the specific direction component (e.g., x-axis component), imaging may be carried out using the polarizing optical member including only the crystal portion in which the sensitivity in that specific direction is the strongest.

(5) In the embodiments described above, the circuit board including the wiring pattern 100 illustrated in FIGS. 4 and 7 is shown as the imaging subject, but this is merely an example. The electromagnetic field imaging device of the present disclosure can image the distribution of the electromagnetic field for various types of imaging subjects including the wiring for transmitting an electric signal. For example, with the circuit board formed with other conductor patterns other than the wiring, the circuit board mounted with various types of electronic components, and the like as the imaging subject, the electromagnetic field from such conductor patterns and various types of electronic components can be imaged. Moreover, the electromagnetic field from the imaging subject (e.g., mounted component) other than the wiring can also be imaged.

When the imaging subject is other than the wiring, the crystal thickness Dt may be, for example, no larger than 1.2 times the smallest interval of the intervals between the adjacent conductor patterns in the imaging subject. Alternatively, when the imaging subject includes the electronic component and the conductor pattern, the crystal thickness may be no larger than 1.2 times the smallest value of the intervals of the electronic component and the conductor pattern, or may be no larger than 1.2 times the smallest value of the intervals between the adjacent electronic components.

The required minimum resolution depends on the configuration of the imaging subject and the imaging purpose. Thus, the crystal thickness Dt may be appropriately determined within a range of no larger than 1.2 times the length corresponding to the minimum resolution based on the minimum resolution required according to the configuration of the imaging subject and the imaging purpose.

(6) In addition, the functions of the single component according to the above embodiments may be distributed to a plurality of components, and functions of the plurality of components may be integrated to the single component. Still further, a part of the configurations of the above embodiments may be omitted. Still further, at least a part of the configurations of the above embodiments may be added or replaced to the configurations of the other embodiment. Still further, all modes contained in the technical ideas specified by the text only described in the scope of claims are the embodiments of the present disclosure.

The invention claimed is:

1. An electromagnetic field imaging device configured to image an electromagnetic field, which is an electric field or a magnetic field, generated from an imaging subject including at least a wiring, the electromagnetic field imaging device comprising:
   a modulated light outputter configured to be able to output a modulated light that is obtained through modulation at a specific modulation frequency;
   a polarizing optical member, which is a plate-shaped member having an electro-optical effect or a magneto-optical effect, arranged so that an opposing surface, which is one of the plate surfaces, faces the imaging subject and the modulated light output from the modulated light outputter enters an incident surface, which is the other one of the plate surfaces, in a perpendicular direction, and configured so that a polarization state and a phase of the modulated light that has entered the member are changed by application of the electromagnetic field when the electromagnetic field exists in the member and a detection light, which is the modulated light after the change, is caused to exit;
   a first supporting member attached to the incident surface of the polarizing optical member to support the polarizing optical member, and through which both the modulated light and the detection light are transmittable;
   a reflection member attached to the opposing surface of the polarizing optical member to reflect the modulated light that has entered the polarizing optical member and propagated to the opposing surface toward the incident surface side;
   a second supporting member configured to support the first supporting member so as to be movable in a direction of a plate thickness of the polarizing optical member;
   a polarized light processor configured to convert the detection light that has exited through the first supporting member from the polarizing optical member to a light modulated according to an intensity and a phase of the electromagnetic field, and output the light;
   a photoelectric convertor arranged to receive the detection light output from the polarized light processor and modulated in the intensity of the electromagnetic field, and configured to photoelectric-convert the received detection light to an electric signal and output the electric signal; and
   an image processor configured to generate and display a two-dimensional image indicating a distribution of the electromagnetic field generated from the imaging subject based on the electric signal output from the photoelectric convertor and the modulation frequency,
   wherein the polarizing optical member has a plate thickness of no larger than 1.2 times a minimum void interval of the wiring.

2. The electromagnetic field imaging device according to claim 1,
   wherein, assuming that the perpendicular direction is a z-axis direction, a specific direction perpendicular to the z-axis direction is an x-axis direction, and a direction perpendicular to the z-axis direction and perpendicular to the x-axis direction is a y-axis direction, the polarizing optical member includes:
   an array structure including at least one of each of at least two of three types of optical portions, an x-axis direction optical portion having a property in which a sensitivity that the polarization state changes by an x-axis component, which is a component in the x-axis direction of the electromagnetic field, is the largest;
   a y-axis direction optical portion having a property in which a sensitivity that the polarization state changes by a y-axis component, which is a component in the y-axis direction of the electromagnetic field, is the largest; and
   a z-axis direction optical portion having a property in which a sensitivity that the polarization state changes by a z-axis component, which is a component in the z-axis direction of the electromagnetic field, is the largest, and
   in which each optical portion is arrayed on a plane perpendicular to the z-axis direction.

3. The electromagnetic field imaging device according to claim 2, wherein the polarizing optical member includes at least one of each of the three types of optical portions.

4. The electromagnetic field imaging device according to claim 3, wherein with a structure in which the x-axis direction optical portion, the y-axis direction optical portion, and the z-axis direction optical portion each are arrayed one by one in a certain direction as a unit structure, the polarizing optical member is configured by arraying a plurality of unit structures in the certain direction, a length in the certain direction in the three types of optical portions all being a same defined length.

5. The electromagnetic field imaging device according to claim 2, further comprising
   a manipulator configured to relatively move the polarizing optical member with respect to the imaging subject.

6. The electromagnetic field imaging device according to claim 4, further comprising:
   a manipulator configured to relatively move the polarizing optical member with respect to the imaging subject in the certain direction; and
   a movement controller that controls the movement by the manipulator, the movement controller being configured to sequentially move a position of the polarizing optical member to three locations spaced apart by the defined length in the certain direction,
   wherein the image processor is configured to individually image the electromagnetic field when the polarizing optical member is arranged at each of the three locations, and generate and display a two-dimensional image indicating a distribution of the electromagnetic field in which the x-axis component, the y-axis component, and the z-axis component are synthesized.

7. The electromagnetic field imaging device according to claim 1, further comprising
   a movable mechanism configured to be able to relatively move the polarizing optical member with respect to the imaging subject in a z-axis direction, which is the perpendicular direction, an x-axis direction, which is a specific direction perpendicular to the z-axis direction, and a y-axis direction, which is a direction perpendicular to the z-axis direction and perpendicular to the x-axis direction, and change an elevation angle about the x-axis and an elevation angle about the y-axis.

8. The electromagnetic field imaging device according to claim 1,
   wherein the detection light that has exited from the polarizing optical member through the first supporting member is transmitted through an object lens and enters the polarized light processor.

* * * * *